(12) United States Patent
Lauer et al.

(10) Patent No.: US 9,722,394 B2
(45) Date of Patent: Aug. 1, 2017

(54) SEMICONDUCTOR LASER DIODE

(71) Applicant: OSRAM Opto Semiconductors GmbH, Regensburg (DE)

(72) Inventors: Christian Lauer, Regensburg (DE); Harald König, Bernhardswald (DE); Uwe Strauβ, Bad Abbach (DE); Alexander Bachmann, München (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/361,647

(22) PCT Filed: Nov. 19, 2012

(86) PCT No.: PCT/EP2012/073004
§ 371 (c)(1),
(2) Date: May 29, 2014

(87) PCT Pub. No.: WO2013/079346
PCT Pub. Date: Jun. 6, 2013

(65) Prior Publication Data
US 2014/0334508 A1    Nov. 13, 2014

(30) Foreign Application Priority Data

Nov. 30, 2011   (DE) .................. 10 2011 055 891

(51) Int. Cl.
*H01S 5/024*   (2006.01)
*H01S 5/10*   (2006.01)
(Continued)

(52) U.S. Cl.
CPC .......... *H01S 5/02469* (2013.01); *H01S 5/024* (2013.01); *H01S 5/10* (2013.01);
(Continued)

(58) Field of Classification Search
CPC ............... H01S 5/0224; H01S 5/02461; H01S 5/02469; H01S 5/02476; H01S 5/0425; H01S 5/02484; H01S 5/02492
(Continued)

(56) References Cited

U.S. PATENT DOCUMENTS

| 5,729,561 A | 3/1998 | Hironaka |
| 6,148,013 A | 11/2000 | Geels et al. |

(Continued)

FOREIGN PATENT DOCUMENTS

| CN | 102214895 A | 10/2011 |
| DE | 19717545 A1 | 9/1998 |

(Continued)

OTHER PUBLICATIONS

Liu, X., et al., "Comparison Between Epi-Down and Epi-Up Bonded High-Power Single Mode 980-nm Semiconductor Lasers," IEEE Transactions on Advanced Packaging, vol. 27, No. 4, Nov. 2004, pp. 640-646.

*Primary Examiner* — Tod T Van Roy
(74) *Attorney, Agent, or Firm* — Slater Matsil, LLP

(57) ABSTRACT

A semiconductor laser diode is provided. A semiconductor layer sequence has semiconductor layers applied vertically one above the other. An active layer includes an active region having a width of greater than or equal to 30 μm emitting laser radiation during operation via a radiation coupling-out surface. The radiation coupling-out surface is formed by a lateral surface of the semiconductor layer sequence and forms, with an opposite rear surface, a resonator having lateral gain-guiding in a longitudinal direction. The semiconductor layer sequence is heated in a thermal region of influence by reason of the operation. A metallization layer is in direct contact with a top side of the semiconductor layer sequence.

12 Claims, 14 Drawing Sheets

(51) Int. Cl.
*H01S 5/022* (2006.01)
*H01S 5/042* (2006.01)
*H01S 5/20* (2006.01)

(52) U.S. Cl.
CPC .......... *H01S 5/1064* (2013.01); *H01S 5/0224* (2013.01); *H01S 5/02461* (2013.01); *H01S 5/0425* (2013.01); *H01S 5/2036* (2013.01); *H01S 5/2054* (2013.01)

(58) Field of Classification Search
USPC .............. 372/29.013, 38.05, 87, 34, 36
See application file for complete search history.

(56) References Cited

U.S. PATENT DOCUMENTS

| | | | |
|---|---|---|---|
| 6,185,238 B1* | 2/2001 | Onomura et al. | ......... 372/46.01 |
| 6,349,104 B1 | 2/2002 | Kato et al. | |
| 7,474,682 B2 | 1/2009 | Mizuuchi et al. | |
| 7,633,982 B2 | 12/2009 | Albrecht et al. | |
| 7,860,139 B2 | 12/2010 | Takayama et al. | |
| 8,233,513 B1* | 7/2012 | Schleuning | ......... H01S 5/02469 327/33 |
| 2002/0037021 A1 | 3/2002 | Ohkubo | |
| 2007/0274360 A1 | 11/2007 | Inoue et al. | |
| 2008/0008217 A1* | 1/2008 | Miller | .................... H01S 5/024 372/36 |
| 2009/0296765 A1 | 12/2009 | Takayama et al. | |
| 2010/0284434 A1 | 11/2010 | Koenig et al. | |
| 2011/0051766 A1 | 3/2011 | Reill et al. | |
| 2011/0243169 A1 | 10/2011 | Lauer et al. | |
| 2011/0249694 A1 | 10/2011 | Nishiguchi et al. | |

FOREIGN PATENT DOCUMENTS

| | | |
|---|---|---|
| DE | 19824247 A1 | 12/1998 |
| DE | 102004036963 A1 | 12/2005 |
| DE | 102008014092 A1 | 7/2009 |
| DE | 102008014093 A1 | 7/2009 |
| JP | H07131117 A | 5/1995 |
| JP | H0936493 A | 2/1997 |
| JP | 964479 A | 3/1997 |
| JP | 2005197596 A | 7/2005 |
| JP | 2006294745 A | 10/2006 |
| JP | 2007221109 A | 8/2007 |
| JP | 2007266575 A | 10/2007 |
| JP | 2009158644 A | 7/2009 |
| JP | 2009295680 A | 12/2009 |
| JP | 2010114202 A | 5/2010 |
| JP | 2011023670 | 2/2011 |
| JP | 2011508440 A | 3/2011 |
| WO | 9838710 A1 | 9/1998 |
| WO | 9966614 | 12/1999 |
| WO | 2005062433 A1 | 7/2005 |

* cited by examiner

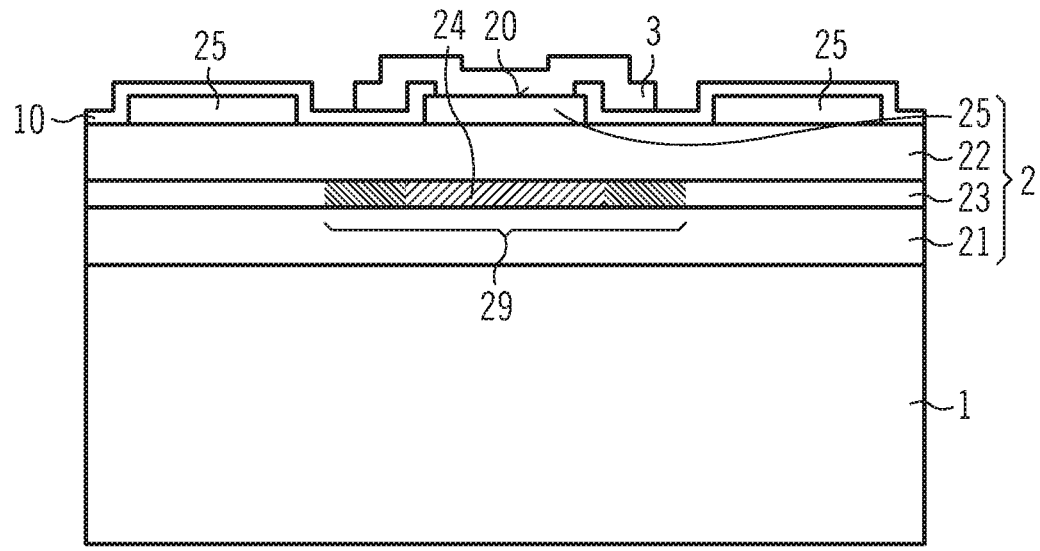
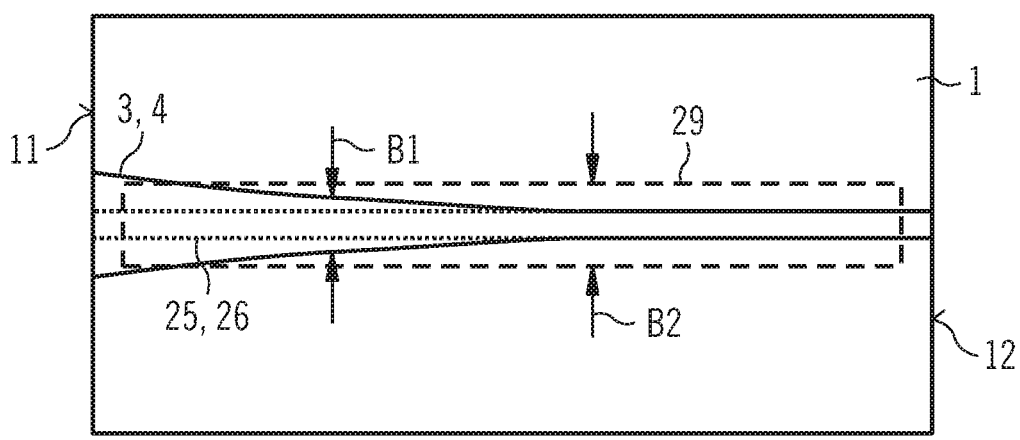

SEMICONDUCTOR LASER DIODE

This patent application is a national phase filing under section 371 of PCT/EP2012/073004, filed Nov. 19, 2012, which claims the priority of German patent application 10 2011 055 891.8, filed Nov. 30, 2011, each of which is incorporated herein by reference in its entirety.

TECHNICAL FIELD

A semiconductor laser diode is provided.

BACKGROUND

High-power laser diode chips which are produced from a semiconductor material which is epitaxially deposited on a substrate are mounted on heat sinks or carriers to ensure sufficient heat dissipation. The heat sinks or carriers have a high thermal conductivity and partly also an active cooling, i.e., a flow of a coolant. Mounting is typically effected by soldering. For this purpose, the laser diode chips have, on the mounting surface, a metallization having a large area which is used as soldering surface.

The sources of heat losses in high-power laser diode chips of a typical design having asymmetric mirror reflectivities and one or more emitter strips are not uniformly distributed. Rather, the sources of heat losses are concentrated on the electrically contacted emitter strips to the greatest extent in the resonator direction close to the coupling-out bevel and in a lateral direction transverse to the resonator direction in the semiconductor material. The heat losses are dissipated by thermal conduction from the chip via the metallization forming the soldering surface and via the solder to the heat sink or to the carrier. The paths of electrical current and heat flow are in this case typically virtually identical.

With respect to temperature management, typical high-power laser diode chips are provided, for the greatest possible heat dissipation, with a thermal bonding surface, which is as large as possible, between the semiconductor chip and the heat sink or the carrier, i.e., with a metallization forming the soldering surface having a greatest possible area. As a result, the thermal resistance of a laser diode chip should be kept as low as possible since important laser parameters can benefit therefrom during operation, for instance, high efficiency, low beam divergence, higher power rating and greater reliability. Against this background, the minimum size for the thermal bonding surface which is to be meaningfully selected approximately corresponds to the region of the expansion of the region producing the heat losses or is somewhat larger owing to heat spreading effects in the semiconductor material.

However, in comparison with the heat sink material or carrier material, the soldering boundary surface typically has a large thermal transfer resistance, whereby in typical laser diode chips a temperature profile can arise which produces a thermal lens owing to the aforementioned inhomogeneous distribution of the heat losses by the temperature dependency of the refractive index and optical gain. This has the consequence that in the case of larger operating currents or output powers, the beam divergence of known laser diode chips is increased.

However, in the known approach of thermally bonding the semiconductor material to a heat sink or a carrier over a surface as large as possible, the optimization of several laser parameters reaches a limit since although the absolute level of the temperature in the semiconductor material can be reduced, the basic inhomogeneity of the temperature distribution is retained. There are no known methods for suppressing the thermal lens produced by the inhomogeneity, except for the optimization of the efficiency of the laser which is in any case performed in a typical manner.

SUMMARY OF THE INVENTION

Particular embodiments provide a semiconductor laser diode in which inhomogeneity in the temperature distribution is reduced compared with known laser diodes.

In accordance with at least one embodiment, a semiconductor laser diode has a semiconductor layer sequence having semiconductor layers applied vertically one above the other. The individual semiconductor layers have a lateral or transverse direction directed perpendicular to the vertical growth direction and a longitudinal direction perpendicular to the vertical direction and to the lateral direction. In particular, the semiconductor layer sequence has an active layer which generates laser radiation in an active region during operation. The laser radiation is emitted via a radiation coupling-out surface during operation, wherein the radiation coupling-out surface is formed by a lateral surface of the semiconductor layer sequence and forms, with an opposite rear surface of the semiconductor layer sequence, a resonator in the longitudinal direction. The semiconductor laser diode described herein is thus preferably a so-called edge-emitting semiconductor laser diode.

A metallization layer is applied in direct contact with a top side of the semiconductor layer sequence, wherein the top side of the semiconductor layer sequence is formed by a semiconductor cover layer. In other words, the semiconductor cover layer is the semiconductor layer which is uppermost in the semiconductor layer sequence in the vertical direction.

A structured heat-dissipating layer is also applied to the top side of the semiconductor layer sequence. The structured heat-dissipating layer has at least the metallization layer.

Furthermore, the active region of the semiconductor laser diode has a width of greater than or equal to 30 μm. Such a semiconductor laser diode can also be referred to as a so-called stripe laser, and in a particularly preferred manner as a so-called broad stripe laser. Furthermore, the width of the active region can be less than or equal to 200 μm and in a particularly preferred manner greater than or equal to 50 μm and less than or equal to 150 μm. In one preferred embodiment, the active region can have a width of approximately 100 μm. The width of the active region is determined substantially by the width of a semiconductor layer defining the lateral current expansion taking into account current expansion effects in the semiconductor layers. This layer, preferably formed in a strip-like manner, is referred to in this case as the current-supplying semiconductor layer and can be formed by the semiconductor cover layer and/or one or more underlying layers.

The resonator of the semiconductor layer sequence is a resonator having at least predominately lateral gain-guiding. In other words, in the case of the semiconductor laser diode described herein, the lateral gain-guiding is predominant over lateral index-guiding in the resonator which could be achieved, for example, by a ridge structure close to the active layer in the semiconductor layers arranged above the active layer. The principles of lateral gain-guiding and lateral index-guiding are known to the person skilled in the art and are therefore not described further. An example of a semiconductor laser which, in contrast to the semiconductor laser diode described herein, has predominately lateral index-guiding, can be a trapezoidal ridge waveguide laser known to the person skilled in the art. A resonator having predominately lateral gain-guiding will be abbreviated hereinafter to resonator having lateral gain-guiding.

By operating the semiconductor laser diode, the semiconductor layer sequence is heated during the generation of the laser radiation in a region which is referred to here and hereinafter as a thermal region of influence. The thermal region of influence of the semiconductor laser diode described herein extends in the longitudinal direction in each case to about 50 μm to the radiation coupling-out surface and the rear surface. In the lateral direction, the thermal region of influence, as seen from the center of the active region, is defined by the distance from the center of the active region, at which the temperature has fallen to a value of Tmin+(Tmax−Tmin)/10, wherein Tmax and Tmin are the overall maximum and overall minimum values of the temperature in the region between the lateral center of the active region and the lateral edge of the semiconductor layer sequence. In the case of a semiconductor laser diode having a plurality of active regions, which are arranged next to each other in the lateral direction, Tmin designates the overall minimum value of the temperature between two adjacent active regions.

Heating of the semiconductor layer sequence outside of the previously defined thermal region of influence, e.g., directly on the radiation coupling-out surface and the rear surface, is not considered hereinafter.

The width of the thermal region of influence depends upon the width of the active region and thus upon the width of the region in the active layer into which current is injected. Owing to the heat spreading effects in the semiconductor layer sequence, the thermal region of influence is always wider than the active region. Typically, the width of the thermal region of influence is smaller than the width of the active region plus approximately 2×50 μm. In other words, the thermal region of influence protrudes beyond the active region in the lateral direction on both sides in each case by less than 50 μm.

The metallization layer further comprises a cumulative width in the region above the thermal region of influence. In the case of a metallization layer which is locally contiguous in its width and unstructured, the cumulative width corresponds to the width of the metallization layer. If the metallization layer has, in the lateral direction in one region a structuring, e.g., openings, a half-tone-like structured edge or wedge-shaped cut-outs as described further below, then the cumulative width designates the sum of the widths of all partial pieces in this region.

In the case of the semiconductor laser diode described herein, the ratio of the cumulative width of the metallization layer to the width of the thermal region of influence varies in dependence upon a distance to the radiation coupling-out surface, wherein the cumulative width and the width of the thermal region of influence are to be used for the ratio at the same distance to the radiation coupling-out surface. The structured heat-dissipating layer thus permits heat dissipation from the active region which varies along a longitudinal and/or lateral direction.

Owing to the varying ratio of the cumulative width of the metallization layer and the width of the thermal region of influence in the longitudinal direction, the local thermal resistance can thus be varied for heat dissipation from the thermal region of influence of the semiconductor layer sequence. The local thermal resistance designates here and hereinafter a variable which is proportional to the quotient from the local temperature increase in the active region of the semiconductor laser diode and the local loss factor density which occurs during operation of the semiconductor laser diode. The local thermal resistance is thus a measurement of the extent to which a sub-region of the active region is heated by operation of the semiconductor laser diode owing to the current injection into the active region and the local loss factor density produced thereby. The higher the local thermal resistance, the higher the local temperature increase becomes at a particular local loss factor density and vice-versa. The local thermal resistance is lower the higher the heat dissipation through the structured heat-conducting layer and is thus also a measurement particularly for the heat dissipation thereof since the local thermal resistance and thus the local temperature increase at a local loss factor density are lower the higher the corresponding local heat dissipation through the structured heat-dissipating layer.

In the case of thermal bonding over a large area through a non-structured heat-dissipating layer, as this is the case in known laser diode chips, the local thermal resistance for the heat dissipation is at least substantially homogeneous everywhere so that a higher temperature increase is produced at locations with a higher local loss factor density than at locations with a lower loss factor density which results in the above-described inhomogeneous temperature distribution particularly in the thermal region of influence. In the case of the semiconductor laser diode described herein, the structuring of the structured heat-dissipating layer and in particular of the metallization layer can advantageously be selected such that in the thermal region of influence the local thermal resistance is adapted to the local loss factor density and is higher in sub-regions in which the local loss factor density is lower than in other sub-regions.

The fact that a layer or an element is arranged or applied "on" or "over" another layer or another element can mean here and hereinafter that said layer or said element is directly arranged in direct mechanical and/or electrical contact on said other layer or said other element. Furthermore, it can also mean that said layer or said element is arranged indirectly on or over said other layer or said other element. Further layers and/or elements can then be arranged between said layer and said other layer or between said element and said other element.

The fact that a layer or an element is arranged "between" two other layers or elements can mean here and hereinafter that said layer or said element is directly arranged in direct mechanical and/or electrical contact or in indirect contact with respect to one of the two other layers or elements and in direct mechanical and/or electrical contact or in indirect contact with respect to the other one of the two other layers or elements. In the case of indirect contact, further layers and/or elements can then be arranged between said one layer and at least one of the two other layers or between said one element and at least one of the two other elements.

In accordance with the above statements, the semiconductor layer sequence has semiconductor layers which each extend along a main plane, wherein the main plane is spanned by the longitudinal and lateral or transverse directions whilst the arrangement direction or growth direction of the semiconductor layer sequence defines the vertical direction of the semiconductor laser diode. If a width, e.g., of a semiconductor layer sequence, of another layer or region is mentioned hereinafter, then this is intended to mean the extent of the relevant element in the lateral or transverse direction. Length refers to the extent in the longitudinal direction whilst thickness or height designates the extent in the vertical direction.

In accordance with a further embodiment, the semiconductor layer sequence has, in addition to the active layer, further functional semiconductor layers, e.g., waveguide layers, shell layers, buffer layers and/or semiconductor contact layers. As the active region, the semiconductor layer sequence can have, for example, a conventional pn-junction, a double heterostructure or a single or multiple quantum well structure. The quantum well structure can comprise, for example, quantum wells, quantum wires or quantum dots or combinations of these structures.

The semiconductor layer sequence can have, for example, one or several semiconductor layers consisting of an arsenide, phosphide or nitride semiconductor material. For long-wave, infrared to red radiation, a semiconductor layer sequence on the basis of $In_xGa_yAl_{1-x-y}As$ is suitable, for example, for red radiation, a semiconductor layer sequence on the basis of $In_xGa_yAl_{1-x-y}P$ is suitable, for example, and for short-wave, visible radiation, i.e., in the range of green to blue light, and/or for UV radiation, a semiconductor layer sequence on the basis of $In_xGa_yAl_{1-x-y}N$ is suitable, for example, wherein in each case $0 \leq x \leq 1$ and $0 \leq y \leq 1$.

The semiconductor layers of the semiconductor layer sequence are preferably grown on a substrate such that the semiconductor layer sequence terminates on the side, facing away from the substrate, with the semiconductor cover layer. After the layers are grown, the substrate can be completely or partially removed. Furthermore, electrode layers are provided on the semiconductor layer sequence for contacting the semiconductor layers. Preferably, the metallization layer, which is in direct contact with the semiconductor cover layer, forms such an electrode layer. The semiconductor cover layer thus preferably forms a semiconductor contact layer which, in a particularly preferred manner, can be highly doped, in particular with a dopant concentration of more than $1 \times 10^{18}$ cm$^{-3}$. Typically, for this purpose, the semiconductor cover layer can have a thickness in the range of about 200 nm. Depending upon the transverse conductivity of the semiconductor cover layer, this can also have a larger or smaller thickness. The side of the semiconductor layer sequence facing away from the metallization layer can be contacted by a further electrode layer.

Furthermore, a passivation layer can be arranged, for example, at least in sub-regions on the top side of the semiconductor layer sequence, which passivation layer is structured such that the metallization layer can directly contact the top side of the semiconductor layer sequence only in a sub-region, in particular in the region of the semiconductor cover layer. The semiconductor cover layer can be, for example, structured and removed in sub-regions. In this case, the top side of the semiconductor layer sequence is formed, in the regions in which the semiconductor cover layer is removed, by the underlying exposed semiconductor layer.

Furthermore, the semiconductor layer sequence can have, between the structured heat-dissipating layer and the active region, a semiconductor layer supplying current to the active region. The current-supplying semiconductor layer can be structured and have a lateral width which varies in the longitudinal direction. For example, the width of the current-supplying layer can become smaller as the distance to the radiation coupling-out surface increases which means that the current-supplying layer has a trapezoidal structure. Alternatively, the current-supplying layer can have a width which becomes larger at least in a sub-region as the distance to the radiation coupling-out surface becomes larger. By varying the width of the current-supplying layer, the width of the thermal region of influence is also varied.

For example, the current-supplying layer can be structured as previously described and can comprise, or be formed by, the semiconductor cover layer. Alternatively or in addition, it is also possible that the structured current-supplying semiconductor layer comprises, or is formed by, a semiconductor layer arranged between the active layer and the semiconductor cover layer. The structured current-supplying semiconductor layer can thus preferably form a strip in the longitudinal direction, which strip extends from the radiation coupling-out surface to the rear surface opposite the radiation coupling-out surface. In the case that the current-supplying semiconductor layer has a width which becomes smaller or larger at least in a sub-region as the distance to the radiation coupling-out surface becomes larger, the width of the current injection and thus the width of the region in which a local loss factor density is produced, can be varied in dependence upon the distance to the radiation coupling-out surface. In particular, in the case of a current-supplying layer which becomes narrower towards the radiation coupling-out surface, the current density and thus also the local loss factor density in the active layer can close to the radiation coupling-out surface be smaller than at a larger distance to the radiation coupling-out surface. In this case, it can be advantageously possible to influence the temperature distribution in particular in the active region and in the surrounding semiconductor layers. By reducing the current density close to the radiation coupling-out surface, it can be possible to lower the increased temperature, which occurs in typical laser diodes, at the radiation coupling-out surface.

Furthermore, the contact surface between the metallization and the top side of the semiconductor layer sequence, which is formed by an opening extending in the longitudinal direction in a passivation layer arranged on its top side, can, for example, be narrower and in shape independent of the width and/or of the structuring of the current-supplying layer.

In accordance with a further embodiment, at least one semiconductor layer has a structured edge between the semiconductor cover layer and the active layer in the lateral direction. The edge in the lateral direction is thus the edge delimiting or defining the width of the semiconductor layer and extends in the longitudinal direction. In particular, the semiconductor layer having the structured edge can be arranged between the structured current-supplying semiconductor layer and the active layer. For example, the edge can be structured in a serration-like manner. By way of such structuring, the current expansion and thus the extent of the active region in the active layer can be influenced in an advantageous manner.

In accordance with a further embodiment, the metallization layer comprises one or, in a particularly preferred manner, a plurality of layers which each consist of a metal or an alloy. Therefore, the metallization layer can have a vertical structure in the form of the plurality of layers. The total thickness of the metallization layer can be up to a few micrometers. For example, the metallization layer can have a layer sequence having the materials Ti/Pt/Au or AuGe/Ni/Au. The layers of the metallization layer can be selected in particular on the basis of producibility, mechanical adhesion between the metal and the top side of the semiconductor layer sequence and the electrical contact resistance of the metal-semiconductor transition.

In accordance with a further embodiment, the structured heat-dissipating layer is formed by the metallization layer. In other words, this means that the metallization layer effects, owing to a structuring in the lateral and/or longitudinal direction in the thermal region of influence, a local thermal resistance along a longitudinal and/or lateral direction which varies.

In accordance with a further embodiment, the ratio of the cumulative width of the metallization layer to the width of the thermal region of influence decreases as the distance to the radiation coupling-out surface increases. As a result it can be achieved that as the distance to the radiation coupling-out surface increases, the bonding surface of the semiconductor layer sequence formed by the metallization layer becomes smaller in relation to the thermal region of influence which means that as the distance to the radiation coupling-out surface increases, there is a lower amount of heat dissipation. In comparison to the known unstructured bonding over a large area by an unstructured metallization over a large area, the temperature is thereby increased in sub-regions of the semiconductor layer sequence as the distance to the rear surface becomes smaller so that temperature differences in the resonator direction can be reduced.

In particular, the metallization layer can have varying structuring and/or a varying width in dependence upon a distance to the radiation coupling-out surface. The varying structuring and/or the varying width preferably can be different, at least in a sub-region, from structuring and/or a width of the semiconductor layers of the semiconductor layer sequence which are arranged between the metallization layer and the active layer. In particular, this can mean that the metallization layer and the semiconductor layers arranged above the active layer, i.e., in particular, for example, the semiconductor cover layer do not form a ridge waveguide structure having identical layer cross-sections in the lateral and longitudinal direction, as this is the case in known ridge waveguide lasers.

In accordance with a further embodiment, the metallization layer has a width which decreases as the distance to the radiation coupling-out surface increases. In other words, the metallization layer becomes narrower as the distance to the radiation coupling-out surface increases. Consequently, as already explained previously, the surface, by means of which the semiconductor laser diode can be arranged on an external carrier or an external heat sink, e.g., by soldering, can be reduced as the distance to the radiation coupling-out surface increases. The heat dissipation through the metallization layer thus becomes lower as the distance to the radiation coupling-out surface increases, whereby the local thermal resistance increases correspondingly. For example, the metallization layer can be wider, close to the radiation coupling-out surface, than the current-supplying semiconductor layer and in particular wider than the thermal region of influence. The phrase "close to the radiation coupling-out surface" refers to the end, facing the radiation coupling-out surface, of the metallization layer in the longitudinal direction. Close to the rear surface, the metallization layer can be narrower than the thermal region of influence and furthermore also narrower than the current-supplying semiconductor layer.

In accordance with a further embodiment, the metallization layer has openings, in particular, for example, openings which are arranged over the current-supplying layer in the vertical direction, wherein the openings can take up a larger surface area as the distance to the radiation coupling-out surface increases. This can mean that as the distance to the radiation coupling-out surface increases, the size, number, density or a combination of these characteristics becomes greater. As a result, the cumulative width of the metallization layer becomes smaller as the distance to the radiation coupling-out surface increases.

In accordance with a further embodiment, a material is arranged in the openings which has a lower thermal conductivity than the metallization layer. Furthermore, it can also be possible that a material is arranged in the openings which has a lower solderability than the metallization layer. Lower solderability can mean in particular that a higher thermal resistance is achieved at the solder boundary surface. As a result, in the region of the openings a lower thermal conductivity and thus a lower heat dissipation of the heat produced in the active region to a heat sink arranged on the metallization can be made possible. The material can be formed, e.g., by a synthetic material, e.g., benzocyclobutene (BCB), by air or even by a vacuum. Furthermore, it is also possible that the material in the openings is formed by a material which cannot be soldered, or cannot be soldered very effectively, e.g., a metal which cannot be soldered very effectively, for instance an oxidized metal. It can also be possible that the metallization is produced without openings and the metallization is then oxidized in mutually separate sub-regions, wherein the surface density of the oxidized sub-regions increases as the distance to the radiation coupling-out surface increases.

In accordance with a further embodiment, the metallization layer has an edge in the lateral direction which is structured in an insular manner. The edge in the lateral direction refers to the edge of the metallization layer by means of which the width of the metallization layer is determined and which extends in the longitudinal direction. An edge having insular structuring can mean in particular that a central strip is arranged in the longitudinal direction over the active region and the metallization layer has, in the lateral direction, islands in addition to the central strip. As the lateral distance to the central strip increases, the islands can preferably have a smaller surface density, i.e., can have one or more characteristics selected from size, number and density which become smaller as the lateral distance to the central strip increases. The structured edge in the lateral direction of the metallization layer can, in a particularly preferred manner, be structured in a half-tone-like manner. Furthermore, it can also be possible that the edge in the lateral direction has openings which become larger as the lateral distance increases as seen from the center of the metallization layer and/or increase in number and/or density.

In accordance with a further embodiment, an internal heat sink is applied to the metallization layer in direct contact. An internal heat sink or integrated heat sink is intended to mean here and hereinafter a region or a layer which is applied directly to the metallization layer directly and preferably without a solder connection and has, at least in a sub-region, a preferably high thermal conductivity. In contrast to an external heat sink or a carrier on which the semiconductor laser diode is soldered, the internal heat sink is thus part of the semiconductor laser diode and is preferably applied to a plurality of semiconductor laser diodes in the form of a wafer composite thereon, is optionally structured and is separated with the wafer composite. By means of the internal heat sink, the thermal resistance can be lowered between the semiconductor layer sequence and an external heat sink since the critical boundary surface with respect to the heat dissipation, formed by the solder surface between the semiconductor laser diode and an external heat sink or an external carrier having typically extremely high thermal contact resistances, can be arranged further away from the semiconductor layer sequence and thus further away from the active region. By way of the high thermal transverse conductivity, the heat path in the layer thickness additionally obtained by the internal heat sink is effectively spread within the internal heat sink in advance of the solder boundary surface and the thermal resistance is thus reduced. In particular, the internal heat sink can have a solder side facing away from the semiconductor layer sequence, via which the semiconductor laser diode can be mounted on an external carrier by a solder layer.

In accordance with a further embodiment, the internal heat sink is not structured in the lateral and longitudinal direction and thus has a homogeneous thermal conductivity in the lateral and longitudinal direction. The varying local thermal resistance in the longitudinal and/or lateral direction can thus be predetermined by the structured metallization layer in accordance with the preceding embodiments, whilst the integrated heat sink merely lowers the total heat resistance of the semiconductor laser diode.

In accordance with a further embodiment, the structured heat-dissipating layer additionally comprises the internal heat sink, wherein the internal heat sink has structuring at least in the lateral and/or longitudinal direction. In other words, the internal heat sink can be part of the structured heat-dissipating layer.

The structuring of the internal heat sink can be formed, for example, by materials having different thermal conductivities, which are arranged in a structured manner in the lateral and/or longitudinal direction. Additionally, the internal heat sink can also have structuring in the vertical direction. For example, the integrated heat sink can comprise one or several metals, for example, selected from Au, Ag, Cu and Ni, alloys, for example, CuW, dielectric materials, for example, an oxide or a nitride such as for instance silicon oxide or silicon nitride, a polymer, for example, BCB, a crystalline semiconductor such as for instance AlN, an amorphous semiconductor such as for instance Si or Ge, diamond, a ceramic material, air or vacuum. The material(s) of the internal heat sink can be applied on the metallization layer, for example, by vapor deposition, sputtering, galvanic deposition, plasma deposition, spin-coating or bonding.

In a particularly preferred manner, the internal sink comprises at least two materials having greatly different thermal conductivities, whereby a contrast-rich thermal profile can be achieved. The degrees of freedom, formed by the structural geometry and the material selection, for the design of the internal heat sink allow the thermal conductivity profile to be adjusted extensively, whereby optimization of the laser parameters of the semiconductor laser diode can be achieved. The internal heat sink can have a thickness of a few hundred nanometers and preferably 1 µm or more. In a particularly preferred manner, the internal heat sink is applied by galvanic deposition when using metallic materials and at a thickness of more than 2 µm. The internal heat sink can be used, in the case of electrically conductive materials, to supply electricity for the metallization layer. If non-electrically conductive materials are used for the internal heat sink, then an electric supply element, e.g., in the form of electric bushings, is provided, by means of which an electric parallel path, in addition to the thermal path, is achieved. The electric parallel path preferably has a low supply resistance with respect to the semiconductor layer sequence.

The thickness of the integrated heat sink should not be less than a minimum thickness in dependence upon the thermal conductivity of the materials used. In the case of gold, for example, the minimum thickness should be 1 µm, preferably at least 2 µm and, in a particularly preferred manner, at least 5 µm.

Furthermore, it can also be possible that the semiconductor laser diode is applied to a structured external heat sink. However, the use of an internal heat sink is advantageous in that the thermally poor solder boundary surface is further away from the semiconductor layer sequence, whereby a lower overall thermal resistance is achieved. Furthermore, in the case of an internal heat sink, there is also no requirement for precise adjustment of the semiconductor laser diode when mounting on a pre-structured external heat sink.

In accordance with a further embodiment, it may be necessary, to avoid disadvantages in the production and/or during operation of the semiconductor laser diode, that one or more materials have to be encapsulated with respect to the surroundings. Such disadvantages may be caused, for example, by oxidation in air, e.g., in the case of copper, by the diffusion of materials into the semiconductor and thus a change in the properties of the semiconductor layer sequence, e.g., in the case of copper, silver or gold, or by metallurgical reactions between different metals. Barriers consisting of enclosed layers can be used, for example, as the encapsulation. For example, platinum or chromium can be used to encapsulate gold and, for example, nickel can be used in the case of copper.

Furthermore, a thin-layer encapsulation can be used to encapsulate a material to be encapsulated. A barrier effect is produced in the case of the thin-layer encapsulation substantially by barrier layers and/or passivation layers designed as thin layers. The layers of the thin-layer encapsulation generally have a thickness of less than or equal to a few 100 nm. The thin layers can be applied, for example, by an atomic layer deposition (ALD) process. Suitable materials for the layers of the encapsulation arrangement are, for example, aluminum oxide, zinc oxide, zirconium oxide, titanium oxide, hafnium oxide, lanthanum oxide. Preferably, the encapsulation arrangement comprises a layer sequence having a plurality of thin layers which each have a thickness between one atom layer and 10 nm inclusive.

Preferably, the internal heat sink is applied by galvanic deposition. As a result, it can be possible to apply metallic layers and/or regions at room temperature or at the subsequent operating temperature of the semiconductor laser diode. Therefore, the finished component can have only very small bracings which can be very advantageous, e.g., especially in the case of thick metallic layers as preferred for the internal heat sink. If, as is typical in the prior art, metals are deposited by vapor deposition or sputtering namely at increased temperatures, then large bracings can be present in the finished component after cooling to room temperature owing to the different thermal expansion coefficients between the materials used, i.e., semiconductor materials, dielectric materials, metals and/or synthetic materials. Examples of expansion coefficients are: $6\times10^{-6}$/K for gallium arsenide, $1.6\times10^{-5}$/K for copper and $1.9\times10^{-5}$/K for silver. Large bracing can result in the performance being impaired, in particular in view of the polarization purity, the efficiency and the divergency, and the reliability of the semiconductor laser diode.

In accordance with a further embodiment, the internal heat sink has a region having a first material which is arranged in the lateral direction between two further regions each having a second material. The second material can have a different, and preferably lower, thermal conductivity than the first material. In addition, it can also be possible that the first and second material alternate in the vertical direction, e.g., that the second material is arranged in the vertical direction between regions of the first material. The second material and/or the first material can also have a wedge shape, wherein, for example, the thickness of the second material increases as the lateral distance increases as seen from a center of the internal heat sink. Furthermore, it can also be possible that, for example, the first material has a width which decreases as the distance to the radiation coupling-out surface increases. Furthermore, it can also be possible that the second material is embedded in the first material, e.g., in the form of a plurality of mutually separate sub-regions. Moreover, a third material can also be provided, for example, and has a thermal conductivity different from the first and second material and is arranged at least partly as described previously for the first or second material.

In accordance with a further embodiment, the internal heat sink can have a smaller length in the longitudinal direction than the semiconductor layer sequence, so that in the region of the radiation coupling-out surface and/or in the region of the rear surface opposite the radiation coupling-out surface the semiconductor layer sequence can have a protrusion over the first material of the heat sink. A second material, for example, having a higher thermal conductivity than the first material, can be arranged in the region of the protrusion. The second material can further be formed from a material melting at a low temperature, in particular at a lower temperature than the first material and having a high thermal conductivity. For example, the second material can be formed by a metal such as, for example, indium having a melting point of approximately 157° C. or tin having a melting point of approximately 230° C. The second material can be applied in the form of a deposition in the region of the protrusion. As a result, it can be possible to produce a plurality of semiconductor laser diodes in a wafer composite having internal heat sinks with the first and second material formed as a deposition and then to separate the individual semiconductor laser diodes. Separation can be effected, for example, by breaking the wafer composite to produce laser bevels. After separation, by heating to above the melting point of the second material, an self adjusted channel of the second material can be formed from the deposition so that a reduction in the local thermal resistance is produced close to the radiation coupling-out surface by the second material and the transition to the first material in the longitudinal direction. The channel can be formed to be concave or convex depending upon the material, provided amount and dimension and process parameters.

In contrast to known laser diode chips in which a connection surface which is as large as possible is provided in order to minimize the thermal resistance on the whole, in the semiconductor laser diode described herein it can be particularly possible to vary the local thermal resistance between the semiconductor layer sequence and an external heat sink by way of the above-described structuring of the heat-dissipating layer, whereby inhomogeneity of the temperature distribution within the semiconductor layer can be reduced in the thermal region of influence. As a result, it can be possible to reduce, on the whole, the power of a thermal lens produced by temperature inhomogeneities, although the total thermal resistance of the semiconductor laser diode and also the absolute temperature level of the semiconductor layer sequence can also be increased compared with known laser diode chips.

In accordance with the above-mentioned embodiments, the described advantageous effects can be achieved in particular by partly decoupling and/or separating the electrical and thermal path in the semiconductor laser diode which, in a particularly preferred manner, is designed as a broad stripe laser. This can be possible by the use of two-dimensionally or three-dimensionally structured metallizations, i.e., the metallization layer or in addition also the internal heat sink, on the solder boundary surface and further, for example, in addition also by a highly-conductive, laterally and longitudinally structured semiconductor layer, e.g., the semiconductor cover layer. As a result, in the thermal region of influence the distributions of electrical current and heat flow can be influenced within certain limits in a mutually independent manner so that the temperature distribution in the semiconductor laser diode can be varied independently of electric parameters and preferably can be homogenized. As described further above, the two-dimensionally or three-dimensionally structured metallization on or close to the semiconductor layer sequence top side can comprise one or more different metals and/or additional materials such as air, vacuum or dielectric materials having different thermal conductivities, so that the thermal conductivity contrast between structured and unstructured regions can be increased. By way of the structuring, the surface thermally connected to an external heat sink or an external carrier can become smaller, whereby the overall thermal resistance of the semiconductor laser diode can increase compared with a case without structuring, whereby however the thickness of the thermal lens can also be reduced.

The above-described monolithic integration of an internal heat sink can also be particularly advantageous, for example, in the form of a thick metallization having high thermal conductivity in order to move the thermally poorly conductive solder boundary surface between an external heat sink or an external carrier and the semiconductor layer sequence further away from the main loss factor source, i.e., the active region, and to lower the overall thermal resistance of the semiconductor laser diode by the thereby improved possible heat spreading. As a result, the previously described increase in the thermal resistance, caused by the structuring of the metallization, can also be at least partly compensated.

BRIEF DESCRIPTION OF THE DRAWINGS

Further advantages, advantageous embodiments and developments are apparent from the exemplified embodiments described hereinafter in conjunction with the figures, in which:

FIGS. 2A and 2B show schematic sectional illustrations of semiconductor laser diodes in accordance with a few exemplified embodiments;

FIGS. 3A to 3D show schematic illustrations of plan views of semiconductor laser diodes in accordance with further exemplified embodiments;

Figure 1A:
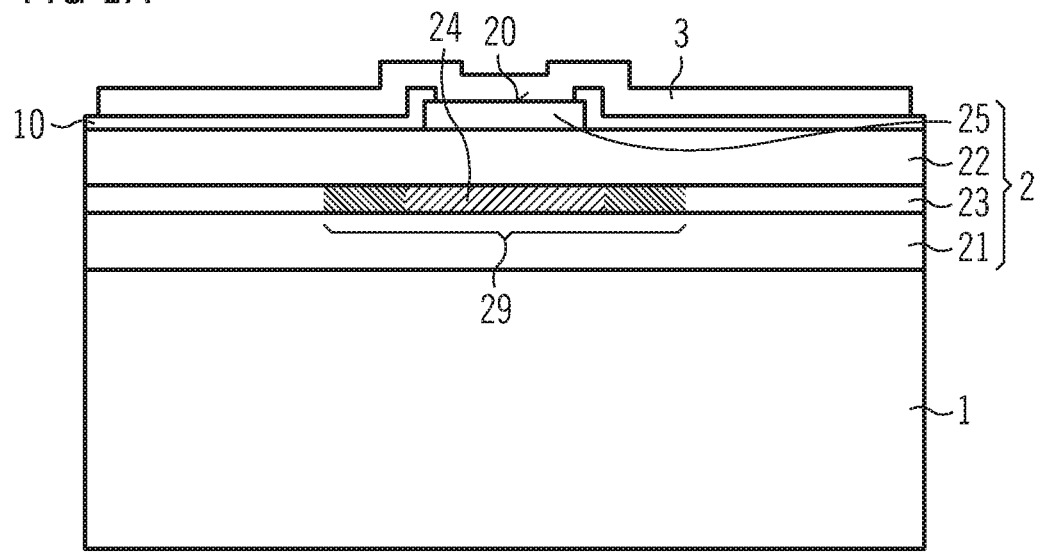
FIGS. 1A and 1B show a schematic sectional illustration and a schematic plan view of a laser diode.

In the exemplified embodiments and the figures, like or similar elements or elements acting in a like manner can each be designated by equal reference numerals. The illustrated elements and the size ratios thereof with respect to each other are not to be considered as being true to scale. Rather, individual elements, such as, for example, layers, components, devices and regions can be illustrated excessively large for ease of reproducibility and/or for ease of understanding.

DETAILED DESCRIPTION OF ILLUSTRATIVE EMBODIMENTS

Figure 1B:
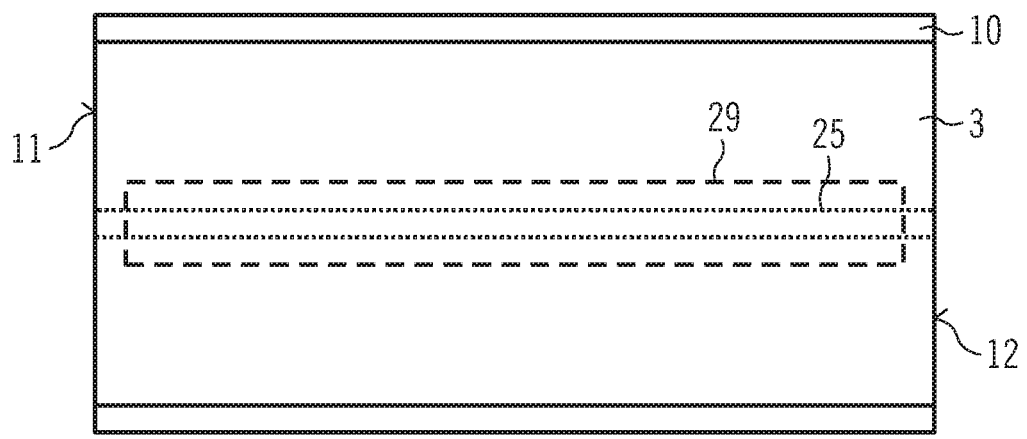

FIGS. 1A and 1B show a typical high-power laser diode chip comprising a semiconductor layer sequence 2 which is epitaxially grown on a substrate 1. FIG. 1A is a sectional illustration whilst FIG. 1B is a plan view.

The semiconductor layer sequence 2 comprises an active layer 23 having an active region 24 which emits laser radiation via a radiation coupling-out surface 11 during operation. The radiation coupling-out surface 11 and the rear surface 12, opposite the radiation coupling-out surface 11, of the semiconductor layer sequence 2 form a resonator and are at least partly provided with a silvering layer or antireflective layer. The semiconductor layers 21, 22, between which the active layer 23 is arranged, can comprise, for example, waveguide layers and/or shell layers and further semiconductor layers. In particular, the high-power laser diode chip illustrated in FIGS. 1A and 1B can be a typical broad stripe laser diode chip having lateral gain-guiding.

The arrangement direction of the semiconductor layers 21, 22, 23, 25 of the semiconductor layer sequence 2 refers in this case and in the following figures to a vertical direction whilst the laser resonator between the radiation coupling-out surface 11 and the rear surface 12 opposite the radiation coupling-out surface 11 extends in the longitudinal direction. A lateral or transverse direction is defined perpendicular to the longitudinal resonator direction in the main extension plane of the semiconductor layers 21, 22, 23, 25.

Arranged above the active region 24 is a semiconductor cover layer 25 which forms the top side 20 of the semiconductor layer sequence 2. The semiconductor cover layer 25 is electrically contacted by a metallization layer 3 which is applied over a large area to the top side of the semiconductor layer sequence 2. Arranged between the regions of the semiconductor layer sequence 2 and the metallization layer 3, which should not be electrical contact with each other, is a passivation layer 10, e.g., consisting of a dielectric material, for instance an oxide or a nitride.

The illustrated laser diode chip can be electrically connected and operated via the metallization layer 3 and a further electrode layer for contacting the side of the semiconductor layer sequence 2 (not shown) facing away from the metallization layer 3. The width of the semiconductor cover layer 25, which in the case of broad stripe lasers is typically greater than or equal to 30 µm and less than or equal to 200 µm, defines—in consideration of current expansion effects in the underlying semiconductor layers 22—the width of the active region 24 which thus likewise has a width of greater than or equal to 30 µm.

The laser diode chip illustrated in FIGS. 1A and 1B is formed as a so-called single emitter having an individual active region 24. A so-called laser bar can also be formed by a corresponding lateral arrangement of several regions of the semiconductor cover layer 25 contacted by the metallization layer 3, wherein the metallization layer 3 is typically severed between the individual active regions so that the individual active regions of the laser bar can be electrically operated independently of each other.

The progression of the semiconductor cover layer 25 is illustrated in FIG. 1B by the dotted line. Apart from current expansion effects, the progression of the semiconductor cover layer 25 also corresponds to the progression of the active region 24. By way of the current injection into the active layer 23 and thus the formation of the active region 24, a thermal region of influence 29 is also formed in the semiconductor layer sequence 2 and is indicated in FIG. 1A in the active layer 23 and in FIG. 1B by the dashed region.

Laser diode chips in accordance with the example of FIGS. 1A and 1B are typically soldered with the metallization layer 3 onto an external heat sink or a carrier having high thermal conductivity and/or active cooling. The metallization layer 3 is used as a solder surface of the laser diode chip and allows the semiconductor layer sequence 2 to be thermally connected to the external heat sink or the carrier over a large area. In particular, for example, for reasons of producibility, for instance in relation to the mechanical adhesion between metal and semiconductor and the electrical contact resistance of the metal-semiconductor transition, the metallization layer 3 typically has a plurality of metallic layers or layers having alloys, e.g., Ti/Pt/Au or AuGe/Ni/Au, having total layer thickness of up to a few micrometers. Whilst in a certain manner the metallization layer 3 is thus structured in the vertical direction, in the laser diode chip illustrated in FIGS. 1A and 1B it is divided in the lateral and longitudinal direction at the most to separate individual active regions in the case of a laser bar when it is necessary to operate individual active regions of the laser bar in a mutually electrically separated manner. Furthermore, it can also be possible that in the proximity of the radiation coupling-out surface 11 or the rear surface 12, the metallization layer is withdrawn therefrom, i.e., is thinner than in the remaining region or is completely removed. Except for such structurings, brought about for technical reasons, the metallization layer 3 of the known laser diode chip covers the entire thermal region of influence 29 in a uniform manner.

Whereas the metallization layer 3 in a typical laser diode chip, as shown in FIGS. 1A and 1B, thus allows to thermally bond in particular the thermal region of influence 29 over a large area, the heat loss sources in the semiconductor layer sequence 2 are not distributed uniformly, for example, owing to asymmetric mirror reflectivities of the silvering layers or antireflective layers of the radiation coupling-out surface 11 and the rear surface 12. In particular, known laser diode chips typically have a maximum temperature at the radiation coupling-out surface 11 at the active region 24, which temperature decreases in the longitudinal, vertical and lateral direction as the distance to the emission region increases. This is also true for a laser bar having several active regions.

Figure 1C:
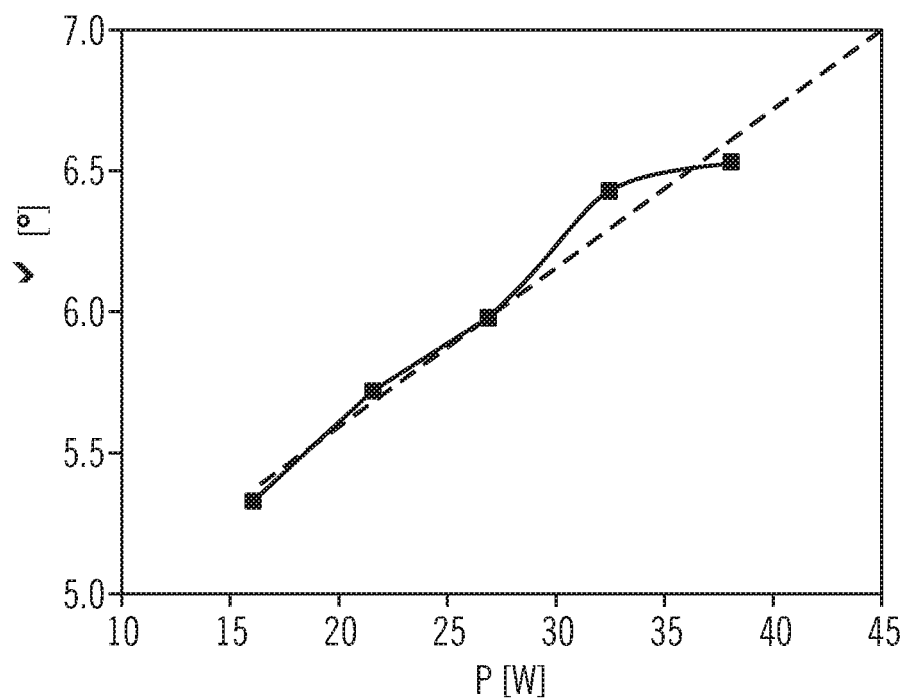
FIG. 1C shows the dependency of the lateral far-field angle of the coupled-out optical power in a laser diode of FIGS. 1A and 1B.

Whereas typically used external heat sinks or carriers itself have a high thermal conductivity compared with the semiconductor material, the solder boundary surface produced during mounting typically has a high thermal transition resistance, e.g., when soldering with AuSn. Additionally a clearly poorer thermal conductivity of the solder material is present compared with the material of the external heat sink or the carrier itself. As a result, despite the high thermal conductivity of the external heat sink or of the carrier, a high thermal resistance is produced. The temperature profile formed in the known laser diode chip and the temperature dependency of the refractive index and optical gain produce a thermal lens, whereby the divergence of the emitted laser radiation is increased. This means that as the operating currents or output powers of the laser diode chip increase, the beam divergence of the laser increases, as shown in FIG. 1C. FIG. 1C shows the increase in the lateral far-field angle α in dependence upon the coupled-out optical power which is present at the increasing thermal loading and the increasing inhomogeneity of the temperature distribution in the laser diode chip by forming the so-called thermal lens.

The semiconductor laser diodes of the exemplified embodiments of the following figures have, proceeding from the known laser diode chip in FIGS. 1A and 1B and in contrast thereto, a structuring suitable to counteract the development of such a thermal lens. The local thermal resistance, i.e., substantially the quotient of the temperature increase of the active region of the semiconductor laser diode and the local loss factor density, is suitably influenced in order to achieve a temperature profile, which is as homogeneous as possible, in the lateral and longitudinal direction in the semiconductor layer sequence 2.

Figure 2A:
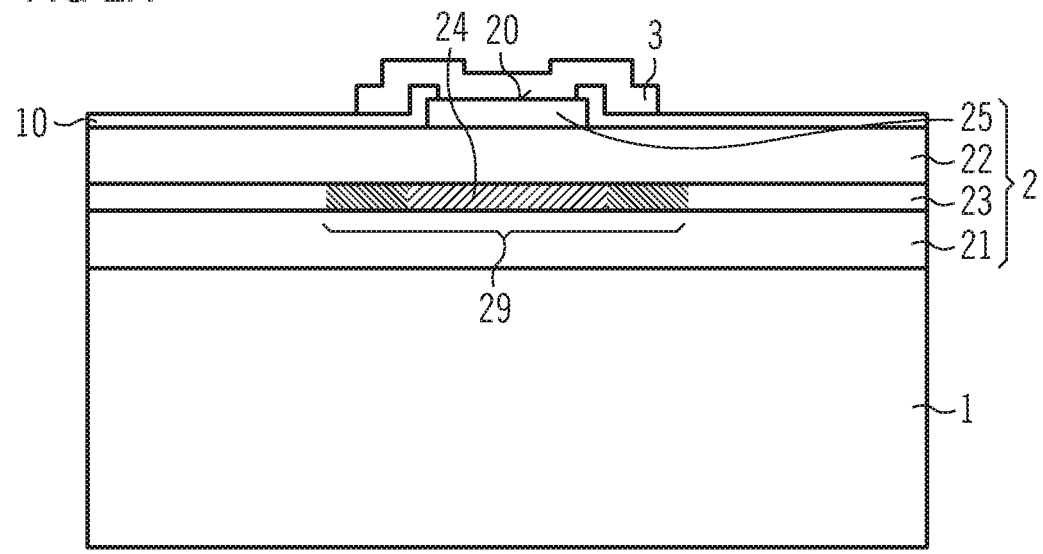

FIGS. 2A and 2B show sectional illustrations of two exemplified embodiments of semiconductor laser diodes. Since the heat loss sources in the semiconductor layer sequence 2 are limited laterally to the active region 24 in consideration of expansion effects which result in the formation of the thermal region of influence defined above in the general part, the semiconductor laser diodes of the following exemplified embodiments have, compared with the known laser diode chip of FIGS. 1A and 1B, a metallization layer 3 whose width is selected to be clearly smaller so that the metallization layer 3 no longer extends over the entire width of the semiconductor layer sequence 2 and thus over the entire top side 20 of the semiconductor layer sequence 2.

Furthermore, the semiconductor cover layer 25 in the exemplified embodiments shown hereinafter is formed as a structured, current-supplying semiconductor layer which has a high dopant concentration of more than $1 \times 10^{18}$ cm$^{-3}$ and thus has a high transverse conductivity. The semiconductor cover layer 25 can, as shown in FIG. 2A, be formed as an individual strip which is contacted by the metallization layer 3. Furthermore, it is also possible, as shown in FIG. 2B, to form the semiconductor cover layer 25 over a large area and to structure it by forming of trenches, so that in addition to the central strip provided for contacting purposes and contacted by the metallization layer 3, non-contacted regions of the semiconductor cover layer 25 remain beneath the passivation layer 10. The structuring of the semiconductor cover layer 25 can be done, e.g., via an etching process, wherein at least approximately 10 μm-wide trenches are produced in addition to the central strip in order to define the region of the semiconductor cover layer 25 to be contacted.

In addition to the elements and layers of the semiconductor laser diode shown here, the diode can also have further features, e.g., trenches between individual emitters or active regions of a semiconductor laser diode formed as a laser bar for optically and electrically separating the individual emitters or even any structuring of the metallization layer or the passivation layer 10 aside from the active region 24.

Exemplified embodiments of semiconductor laser diodes are shown hereinafter which can have a structure in accordance with the exemplified embodiments of FIGS. 2A and 2B. In particular, the semiconductor laser diodes in accordance with the following exemplified embodiments have a structured heat-dissipating layer 4 on the top side of the semiconductor layer sequence which has a structured metallization layer 3. The structured heat-dissipating layer 4 allows heat dissipation from the active region 24 with a local thermal resistance which varies in a longitudinal and/or lateral direction.

By the embodiments of the heat-dissipating layer 4 shown hereinafter, it can be possible to at least partly decouple or separate the electrical and thermal paths in the case of the shown semiconductor laser diodes, whereby the distributions of electrical current and heat flow can be influenced within certain limits in a mutually independent manner so that the respective temperature distribution in the semiconductor layer sequence 2 changes independently of the electric parameters and is preferably homogenized within and in the area surrounding the current injection region.

The semiconductor layer sequence 2 has, in the exemplified embodiments shown hereinafter, a structured, current-supplying semiconductor layer 26 which is explained by way of example with the aid of a structured semiconductor cover layer 25. Alternatively or in addition thereto, semiconductor layers beneath the semiconductor cover layer 25 and above the active region 24 can also be structured in an identical or different manner.

Furthermore, the metallization layer 3 on the top side 20 of the semiconductor layer sequence 2 is used on the one hand to produce a metal-semiconductor contact with the semiconductor cover layer 25 but also on the other hand to provide a solderable surface by means of which the shown semiconductor laser diodes can be mounted on an external heat sink or carrier.

By way of the structuring of the heat-dissipating layer 4 shown hereinafter and optionally also the current-supplying semiconductor layer 26, these have, at least in some or all three dimensions, laterally, longitudinally and vertically different forms, i.e., different geometries and/or layer thicknesses which, in addition to the illustrated exemplified embodiments, can also be formed in several stages or from several different materials.

The exemplified embodiments shown hereinafter each have a metallization layer 3 having a cumulative width B1, the ratio of which to the width B2 of the thermal region of influence 29 varies in dependence upon the distance to the radiation coupling-out surface 11.

FIGS. 3A to 3D show exemplified embodiments of semiconductor laser diodes in which the structured heat-dissipating layer 4 is formed by the metallization layer 3. In the illustrated exemplified embodiments, the metallization layer 3 has a cumulative width B1 which corresponds to the lateral width which becomes smaller as the distance to the radiation coupling-out surface 11 increases. The current-supplying semiconductor layer 26 has, in contrast, a width which stays the same, whereby the width of the active region 24 and thus also the width B2 of the thermal region of influence 29 also remains substantially the same in the longitudinal direction. As a result, the ratio of the cumulative width B1 of the metallization layer 3 to the width B2 of the thermal region of influence 29 is reduced as the distance to the radiation coupling-out surface 11 increases.

As shown in FIG. 3A, the metallization layer 3 can have, close to the radiation coupling-out surface 11, a width B1 which is greater than or equal to the width B2 of the thermal region of influence 29 and thus also greater than the width of the current-supplying semiconductor layer 26. As the distance to the radiation coupling-out surface 11 increases, the width B1 of the metallization layer 3 decreases so that the metallization layer 3 is only as wide in the region of the rear surface 12 as the current-supplying semiconductor layer 26 and is thus narrower than the thermal region of influence 29.

Figure 3B:
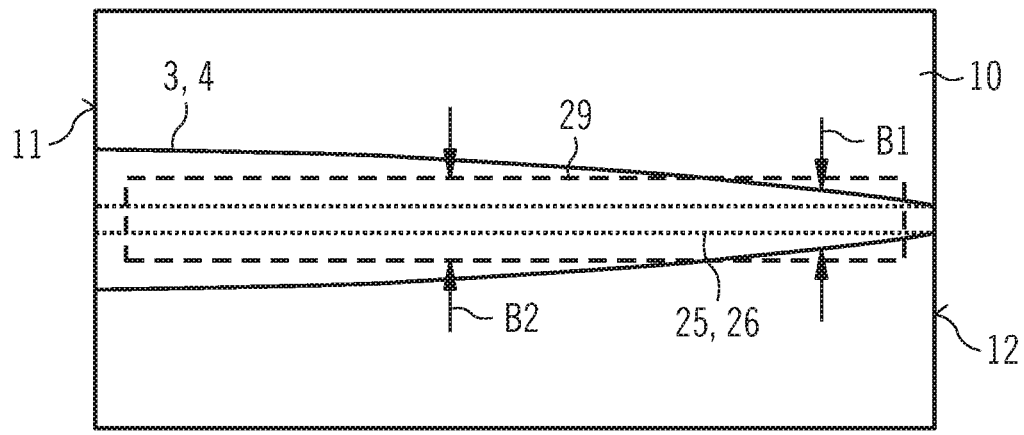

As shown in FIG. 3B, the width B1 of the metallization layer 3 can also be reduced to the extent that it is even narrower than the thermal region of influence 29 in the region of the rear surface 12. Owing to the high transverse conductivity of the highly doped current-supplying semiconductor layer 26, the current is injected into the active layer 23 despite the narrower metallization layer 3 and thus the narrower contact region in the region of the rear surface 12 having a uniform width over the entire resonator length.

Figure 3C:
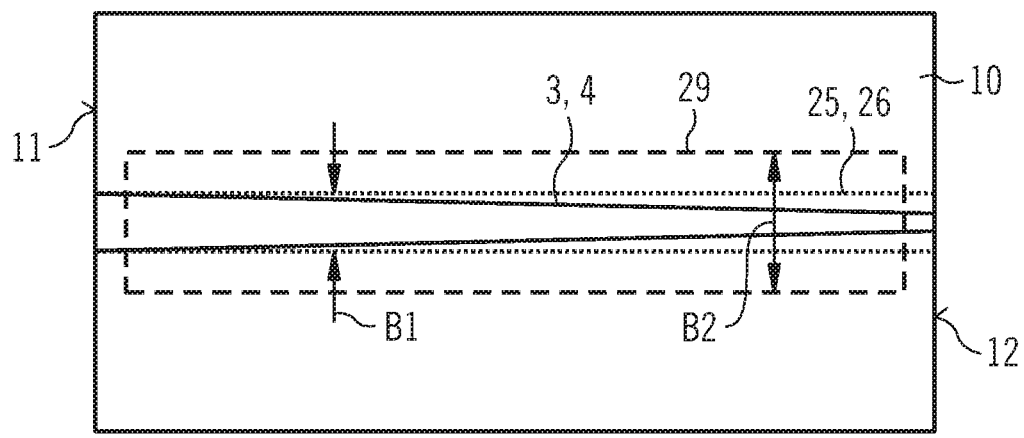

FIG. 3C shows a further exemplified embodiment in which the metallization layer 3 has a width which corresponds in the region of the radiation coupling-out surface 11 to the width of the current-supplying semiconductor layer 26 and which is reduced towards the rear surface 12.

Figure 3D:
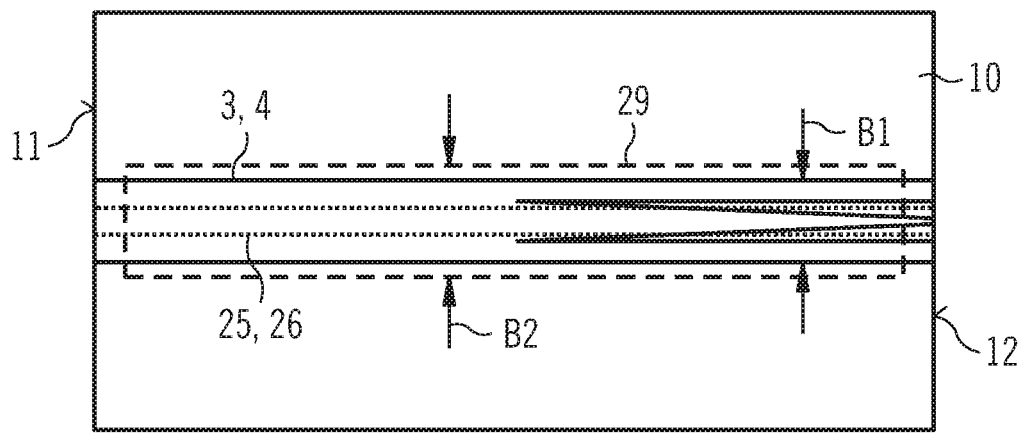

FIG. 3D shows a further exemplified embodiment in which the metallization layer 3 has wedge-shaped cut-outs away from the rear surface 12, whereby the cumulative width B1 of the metallization layer 3 is likewise reduced as the distance to the radiation coupling-out surface 11 increases in comparison with the width B2 of the thermal region of influence 29.

By reducing the cumulative width B1 of the metallization layer 3 formed as a structured heat-dissipating layer 4 as the distance to the radiation coupling-out surface 11 increases in comparison with the width B2 of the thermal region of influence 29, the solderable surface and thus also thermal connecting surface of the illustrated semiconductor laser diodes is reduced as the distance to the radiation coupling-out layer 11 increases. As a result, in the region of the radiation coupling-out surface 11 more heat is dissipated than in the region of the rear surface 12, whereby the temperature distribution profile in the longitudinal direction, which is inhomogeneous in known laser diode chips, can be counteracted by a structured local thermal resistance. In the case of the semiconductor laser diodes shown in this case, the local thermal resistance in the thermal region of influence 29 is impaired or reduced compared with known laser diode chips in regions having a smaller temperature increase, whereby although the overall temperature of the active region 24 possibly increases, the effect of the thermal lens can be reduced by reducing the inhomogeneous temperature distribution.

Figure 4A:
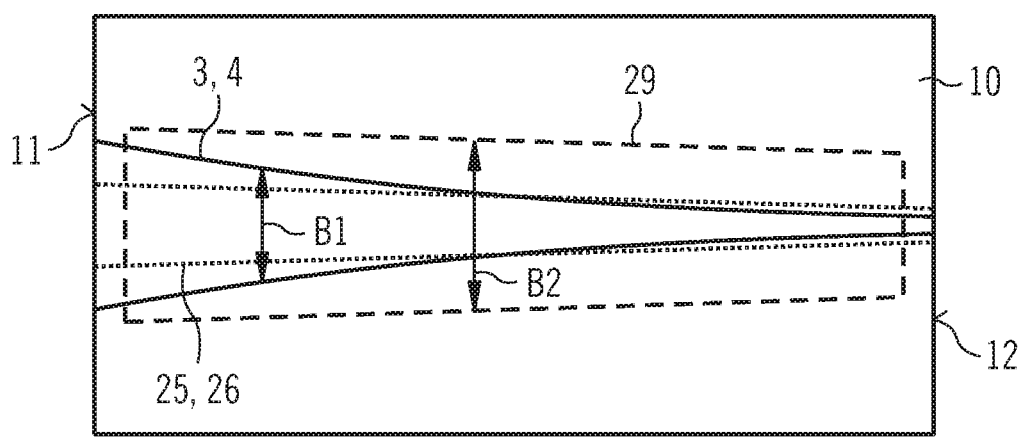
FIGS. 4A and 4B show schematic illustrations of plan views of semiconductor laser diodes in accordance with further exemplified embodiments.
Figure 4B:
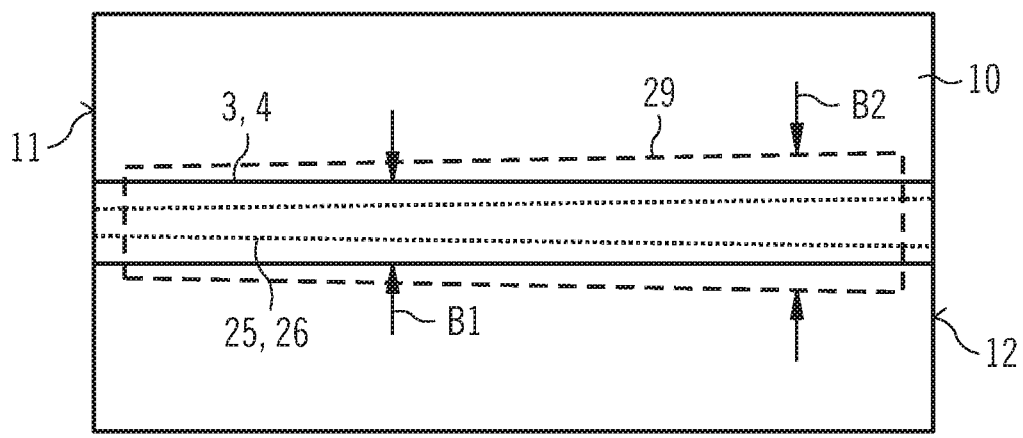

FIGS. 4A and 4B show further exemplified embodiments of semiconductor laser diodes in which the current-supplying semiconductor layer 26, i.e., the semiconductor cover layer 25 purely by way of example in the illustrated exemplified embodiments, is structured with respect to its width.

In the exemplified embodiment of FIG. 4A, the current-supplying semiconductor layer 26, i.e., the semiconductor cover layer 25 in the illustrated exemplified embodiment, has a width which becomes larger towards the radiation coupling-out surface 11. The active region 24 resulting therefrom thereby has a trapezoidal shape. Accordingly, a thermal region of influence 29, whose width B2 decreases as the distance to the radiation coupling-out surface 11 increases, is thus also formed. The metallization layer 3 has a width B1 which likewise decreases as the distance to the radiation coupling-out surface 11 increases, wherein the change in the width B1 is greater than the change in the width B2 which means that the ratio of the width B1 to the width B2 likewise decreases as the distance to the radiation coupling-out surface 11 increases. Owing to the described formation of the current-supplying semiconductor layer 26 and the metallization layer 3, an adaption of the current injection to the mode propagation and expansion, and an optimization of the current injection profile can be combined with the adapted heat dissipation, described in this case, from the thermal region of influence 29.

In the exemplified embodiment of FIG. 4B, the metallization layer 3 has a constant cumulative width B1 between the radiation coupling-out surface 11 and the rear surface 12, whereas the current-supplying semiconductor layer 26, i.e., the semiconductor cover layer 25 in the illustrated exemplified embodiment, becomes wider as the distance to the radiation coupling-out surface 11 becomes larger, whereby the width B2 of the thermal region of influence 29 also increases as the distance to the radiation coupling-out surface 11 becomes larger. By way of the inhomogeneous electrical bonding of the active layer 23 or the active region 24 to the metallization layer 3 having a constant width and the resulting reduction of the ratio of the widths B1 and B2, the formation of an inhomogeneous temperature distribution with increased temperature in the region of the radiation coupling-out surface 11 can be counteracted.

The preceding designs for the ratio of the widths B1 and B2 are also applicable for the exemplified embodiments of the following figures, in which the widths B1 and B2 are no longer shown for reasons of clarity.

Figure 5:
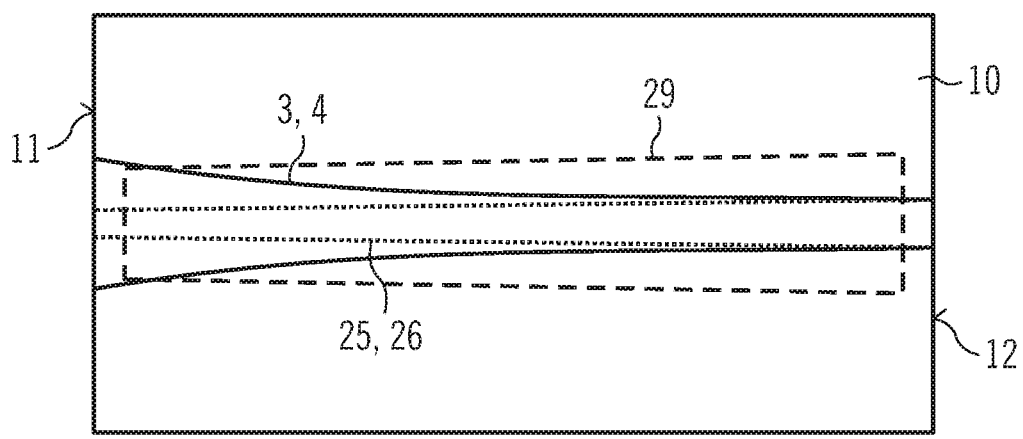
FIGS. 5 to 7 show schematic illustrations of plan views of semiconductor laser diodes in accordance with further exemplified embodiments.

FIG. 5 shows a further exemplified embodiment of a semiconductor laser diode in which the properties of the metallization layer 3 in accordance with the exemplified embodiment of FIG. 3A and the properties of the structured current-supplying semiconductor layer 26 in accordance with the exemplified embodiment of FIG. 4B are combined in order to achieve an improvement of the homogenization of the temperature profile by combining the described effects.

Figure 6:
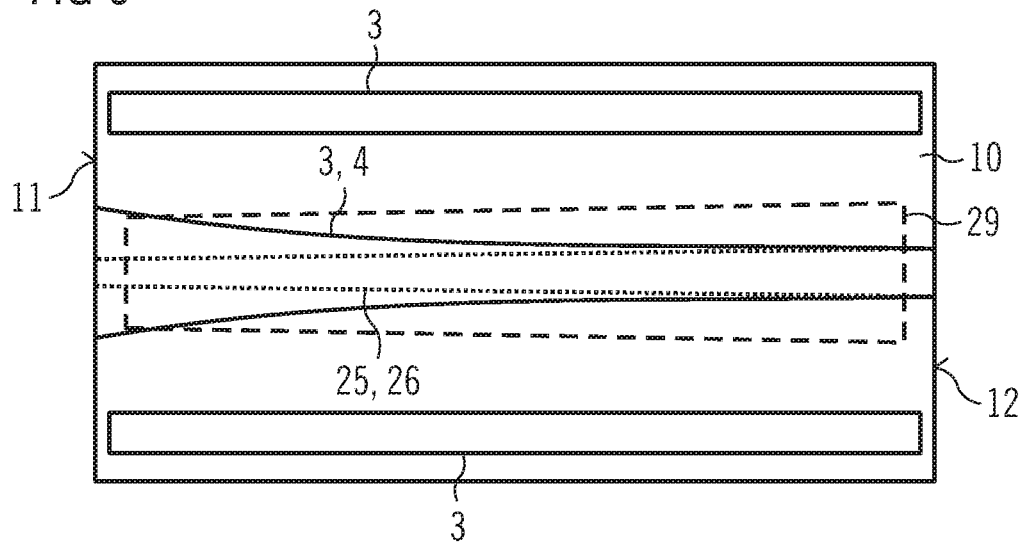

FIG. 6 shows a further exemplified embodiment of a semiconductor laser diode in which the metallization layer 3 has, in comparison with the exemplified embodiment of FIG. 5, in addition to a central strip which is applied for electrically contacting the semiconductor layer sequence 2, further strips having the metallization layer material 3. As a result, an additional solder contact surface is rendered possible aside from the thermal region of influence 29.

Figure 7:
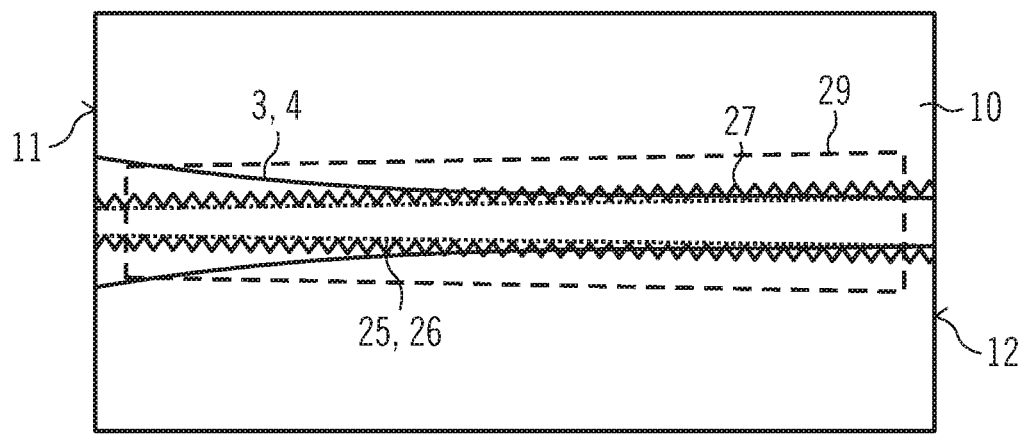

FIG. 7 shows a further exemplified embodiment of a semiconductor laser diode in which, in comparison with the exemplified embodiment of FIG. 5, a further semiconductor layer 27 below the structured current-supplying semiconductor layer 26, i.e., the semiconductor cover layer 25 in the illustrated exemplified embodiment, has a structured edge in the lateral direction. FIG. 7 illustrates, purely by way of example, serration-like structuring. By way of such structuring of the lateral edge of one or more semiconductor layers 27 below the current-supplying semiconductor layer 26, the current density profile in the active layer 23 can additionally be formed.

In the following figures, the thermal region of influence 29 is not shown for reasons of clarity.

Figure 8:
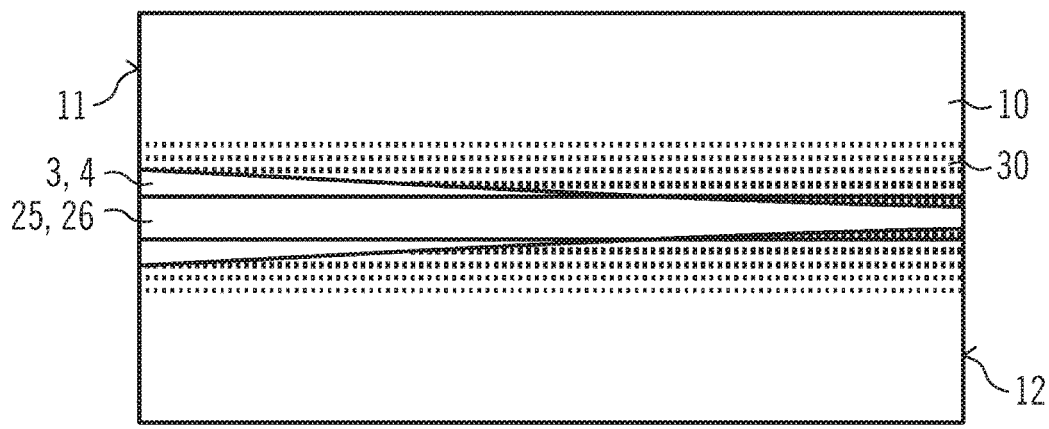
FIGS. 8 to 9C show schematic illustrations of plan views and sectional illustrations of semiconductor laser diodes in accordance with further exemplified embodiments.

FIG. 8 shows a semiconductor laser diode in accordance with a further exemplified embodiment which illustrates a further development of the exemplified embodiment shown in FIG. 3B. The current-supplying layer 26 is designed purely by way of example with a width which stays the same in the longitudinal direction from the radiation coupling-out surface 11 to the rear surface 12, whereas the metallization layer 3 has a central strip as the structured heat-dissipating layer 4, the width of the central strip decreasing as the distance to the radiation coupling-out surface 11 increases.

Furthermore, the metallization layer 3 has, in the lateral direction in addition to the central strip, insular regions 30 having the material of the metallization layer 3 so that the metallization layer 3 has an edge in the lateral direction which is structured in an insular manner. In particular, the structuring can be half-tone microstructuring of the metallization layer 3 for the targeted production of hollow spaces or cavities in a solder layer applied thereon or for preventing a solder connection between a solder and the metallization layer 3, whereby the local thermal resistance can be additionally structured. The cumulative width of the metallization layer 3 decreases as the distance to the radiation coupling-out surface 11 increases.

The insular structuring 30 can become smaller in the lateral direction with respect to the size, number and/or density of the islands as the distance from the central strip increases. In particular, the lateral structuring can have size and distance ranges in a region of less than or equal to 1000 μm down to a few micrometers and, in a particularly preferred manner, greater than or equal to 3 μm. The height of the individual insular region 30 can be in a size range of greater than or equal to 1 nm to less than or equal to 100 μm. In the region of the insular structuring 30, in particular a black region denotes a solder connection and thus a high thermal conductivity whilst a white region denotes a non-existing solder connection or a cavity and thus a low thermal conductivity.

Figure 9A:
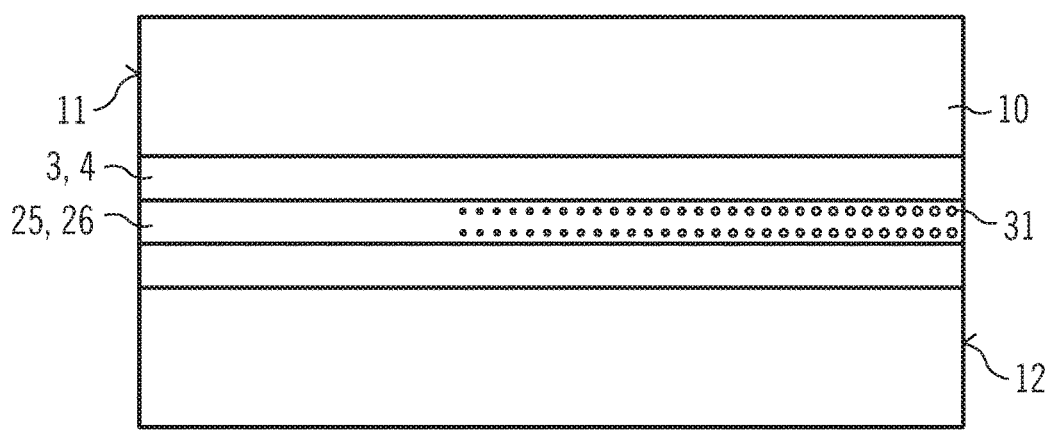
Figure 9B:
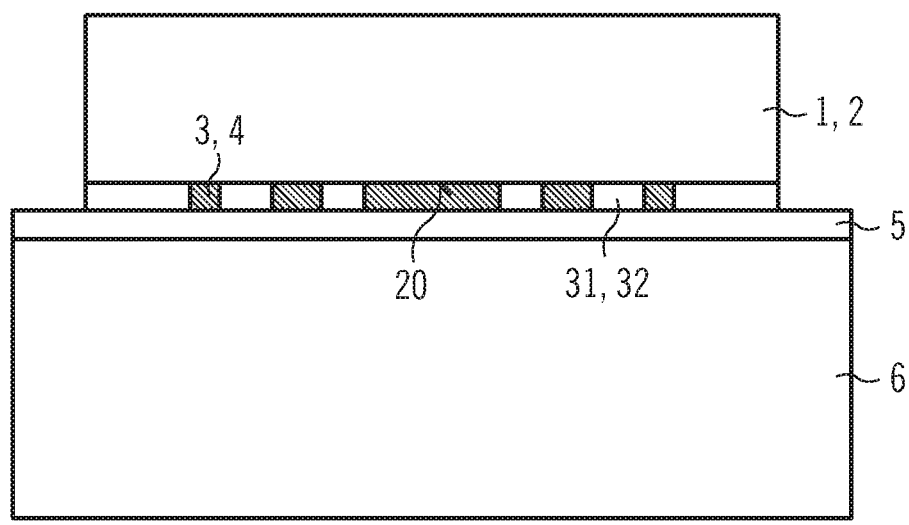
Figure 9C:
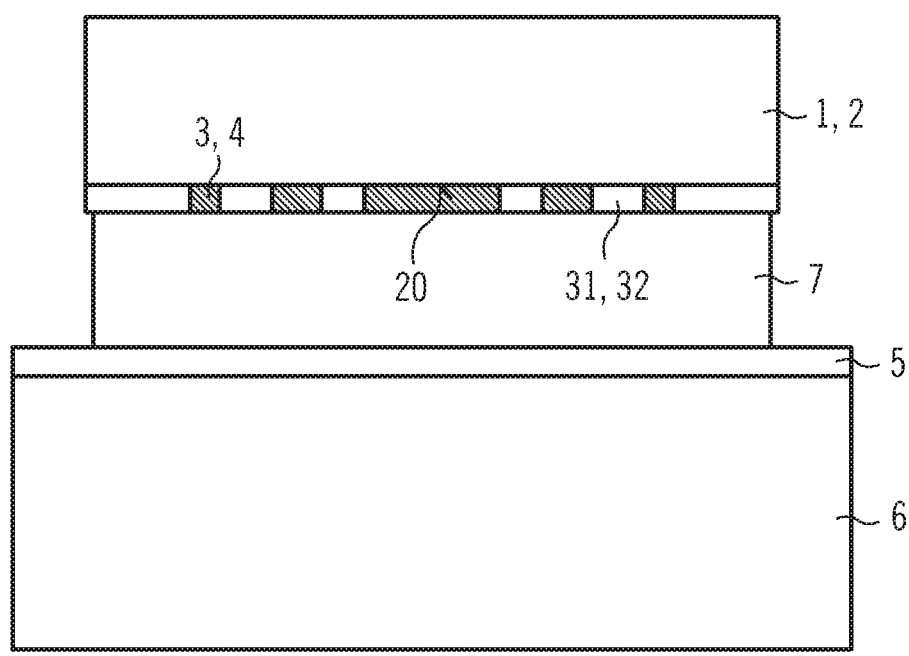

FIGS. 9A to 9C show further exemplified embodiments of semiconductor laser diodes which, in comparison with the preceding exemplified embodiments, have a metallization layer 3 formed as a structured heat-dissipating layer 4 and comprising openings 31 which take up a larger surface area in terms of their size, number and/or density as the distance to the radiation coupling-out surface 11 increases, whereby the cumulative width of the metallization layer 3 likewise decreases as the distance to the radiation coupling-out surface 11 increases. As shown in FIG. 9A, the openings 31 can increase, e.g., in terms of their size as the distance to the radiation coupling-out surface 11 increases. Therefore, the metallization layer 3 provides overall a flat connection surface for solder in which, however, in the region of the openings 31 no solder connection or cavity occurs which results in a low thermal conductivity in these regions.

FIG. 9B shows a sectional image in which, in accordance with a further exemplified embodiment, a semiconductor laser diode having the substrate 1, the semiconductor layer sequence 2 and a metallization layer 3 structured with openings 31 in accordance with the preceding exemplified embodiment is arranged on an external heat sink 6 by a solder layer 5. The longitudinal resonator direction is perpendicular to the plane of the drawing. Owing to the metallization layer 3 formed as a structured heat-dissipating layer, structuring of the solder boundary surface is produced in particular owing to the missing metallization in the openings 31, which, as shown in the illustrated exemplified embodiment, can be further increased by introducing a material 32 into the openings 31, which material cannot be soldered or is poorly solderable or conducts heat poorly. For example, poorly solderable metals, e.g., oxidized metals can be produced or introduced within the openings 31, or even a material having low thermal conductivity, e.g., air, vacuum or a synthetic material such as for instance BCB. With respect to a possibly high contrast of the thermal conductivity, a metallization layer 3 with openings 31 filled with air or a vacuum is particularly advantageous. In mechanically critical chip designs, it is advantageous in terms of a greater mechanical stability to use, instead of openings 31 filled with air or a vacuum, a material 32 which has a thermal conductivity which is as poor as possible and which permits mechanical attachment, i.e., for example, a synthetic material or a metal oxide which conducts heat poorly.

In the exemplified embodiment of FIG. 9C, the semiconductor laser diode has, on the metallization layer 3 which is designed as a structured heat-dissipating layer 4 as in the preceding exemplified embodiment of FIG. 9B, an internal heat sink 7 which is applied directly on the metallization layer 3 in direct contact. By way of such an internal heat sink 7 it is possible to lower the overall thermal resistance of the semiconductor laser diode and despite this thereby to achieve structuring of the local thermal resistance rich in contrast. The side of the internal heat sink 7 facing away from the semiconductor layer sequence 2 is designed as a solder surface for mounting the semiconductor laser diode on the external heat sink 6 by the solder layer 5.

The internal heat sink 7 can consist of an individual layer of a material or also of several layers. Furthermore, it is also possible that the internal heat sink 7 has lateral and/or longitudinal structuring, as shown in conjunction with the following exemplified embodiments.

The internal heat sink 7 can comprise, for example, one or more metals, alloys, dielectric materials, polymers, crystalline semiconductors, amorphous semiconductors, diamond, ceramic material, air, vacuum or combinations thereof, as described in the general part. The internal heat sink 7 can be applied in particular by vapor deposition, sputtering, galvanic deposition, plasma deposition, spin-coating or bonding. If required, one or more materials or layers of the internal heat sink, as described in the general part, can be encapsulated with respect to the surroundings, e.g., by a metal which does not react very well or by a thin-layer encapsulation as described above in the general part.

In the following exemplified embodiments, semiconductor laser diodes having an additional structured internal heat sink 7 are shown, which heat sink is formed as part of the structured heat-dissipating layer 4. The semiconductor layer sequence 2 and the metallization layer 3 can be designed as in one of the preceding exemplified embodiments. The structurings of the internal heat sink 7 in two or three dimensions shown in the following exemplified embodiments renders it possible to additionally influence, in a targeted manner, the thermal conductivity in all three dimensions and thus to achieve structuring of the local thermal resistance. In particular, the internal heat sinks 7 shown hereinafter have different regions which consist of different materials 71, 72, 73 having different thermal conductivities.

In comparison with conventional heat sinks, which typically have in the vertical direction several metal layers or combinations of metals, semiconductors and/or ceramic materials, e.g., so-called DCB ("direct copper bonded") consisting of copper and aluminum nitride and which are thus structured vertically, the internal heat sinks 7 shown in this case are structured laterally and/or longitudinally. The choice of materials 71, 72, 73 is not only based, as in the known vertically structured heat sinks, on the producibility or the adjustment of a thermal expansion coefficient adapted to the semiconductor materials, but also with respect to the homogenization of the temperature distribution prevailing in the semiconductor material.

Figure 10A:
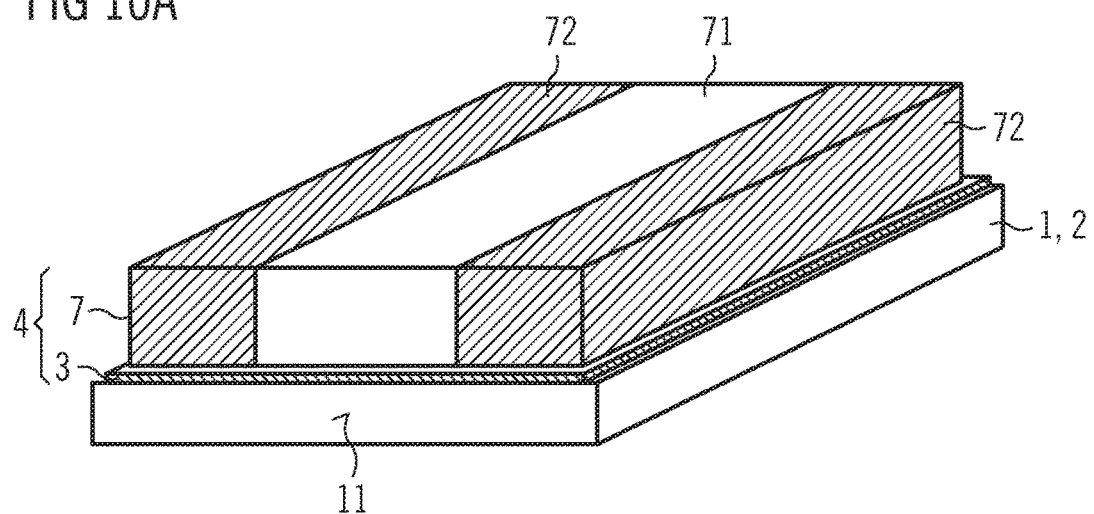
FIGS. 10A to 11 show schematic illustrations of semiconductor laser diodes in accordance with further exemplified embodiments.

In the exemplified embodiment of FIG. 10A, the internal heat sink 7 of the semiconductor laser diode has a first material 71 which is arranged laterally between regions having a second material 72. The first material 71 has, in the exemplified embodiment of FIG. 10A and in the following exemplified embodiments of FIGS. 10B to 10H, a higher thermal conductivity than the second material 72, so that preferably heat can be dissipated in the proximity of the active region.

Figure 10B:
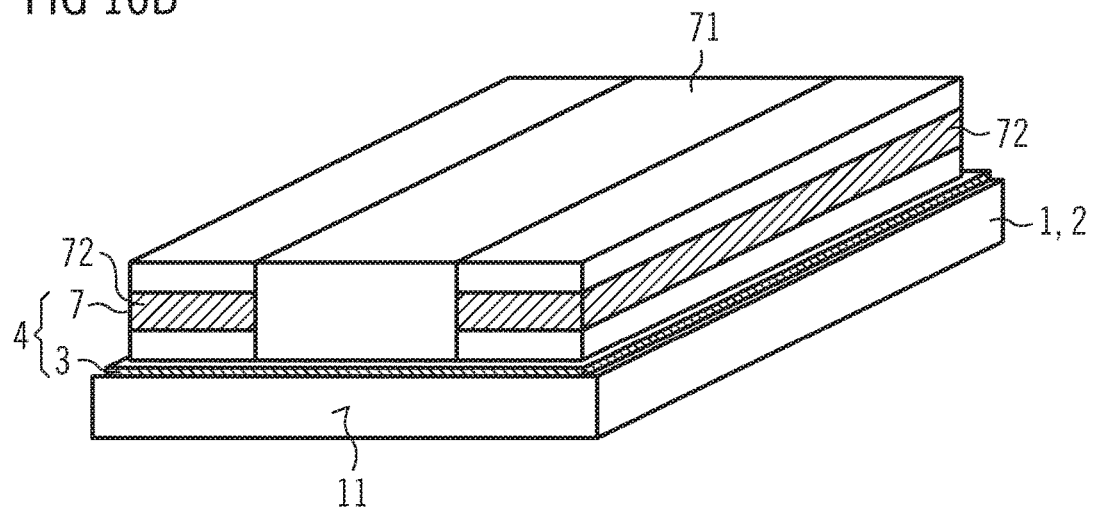

In comparison to the exemplified embodiment of FIG. 10A, the semiconductor laser diode in accordance with the exemplified embodiment of FIG. 10B has an internal heat sink 7 which, on its sides facing towards and facing away from the semiconductor layer sequence 2, additionally has the first material 71 above and below the second material 72, whereby it is possible to achieve a higher thermal conductivity compared with the exemplified embodiment of FIG. 10A.

Figure 10C:
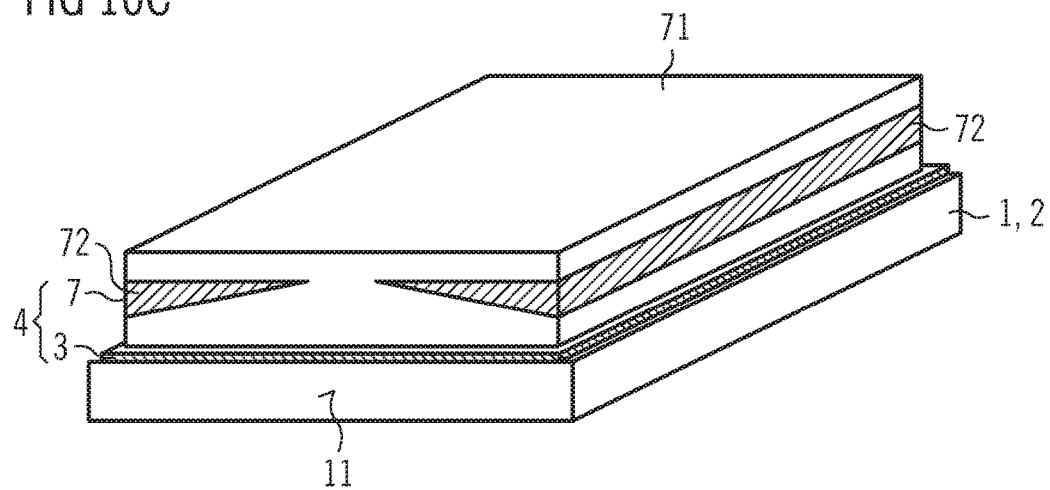

In the exemplified embodiment in accordance with FIG. 10C, the second material 72 has additional structuring having a thickness which increases outwardly in the lateral direction, whereby the thermal conductivity can be continuously reduced outwardly in the lateral direction.

Figure 10D:
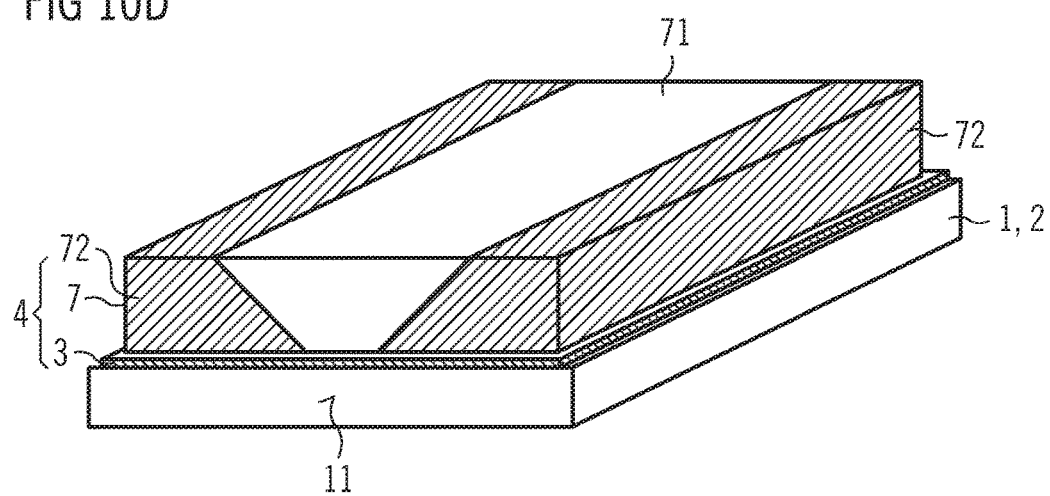

In the exemplified embodiment in accordance with FIG. 10D, the first material 71 has a width which increases as the distance to the semiconductor layer sequence 2 increases, whereby it is possible to achieve an expansion in the heat flow from the metallization layer 3 to an external heat sink on the side of the internal heat sink facing away from the semiconductor layer sequence 2.

Figure 10E:
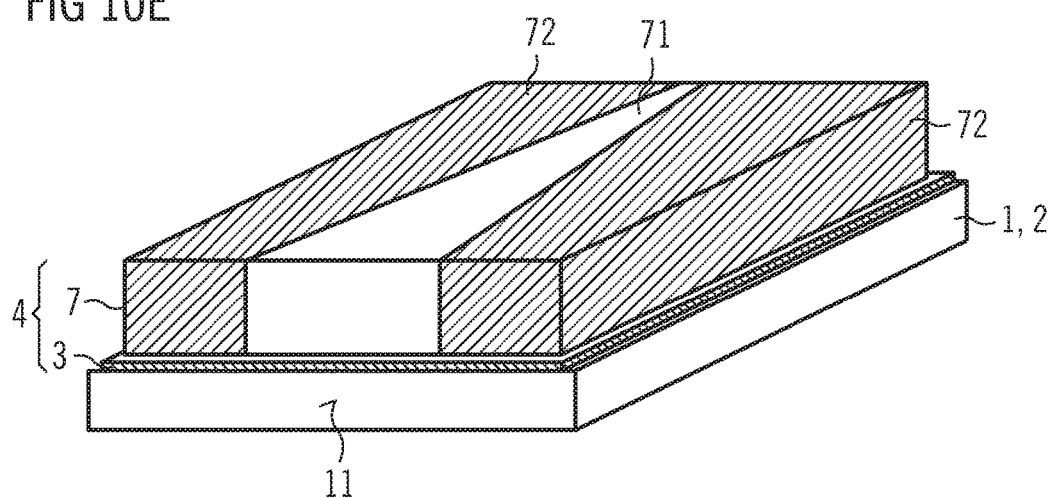

FIG. 10E illustrates a further exemplified embodiment for a semiconductor laser diode in which the first material 71 has a width which becomes smaller as the distance to the radiation coupling-out surface 11 increases, so that in the region of the radiation coupling-out surface 11 more heat can be dissipated than in the proximity of the rear surface opposite the radiation coupling-out surface 11.

Figure 10F:
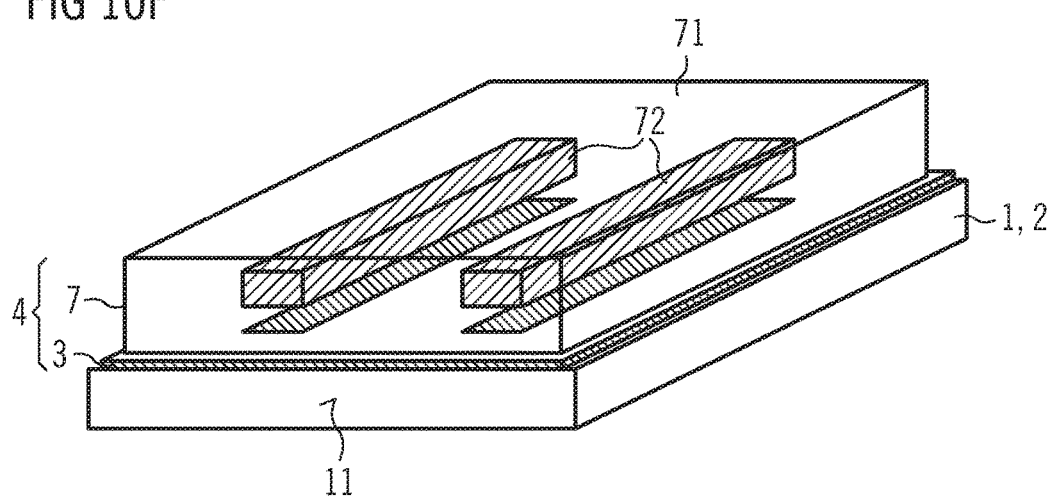

In the exemplified embodiment of FIG. 10F, the second material 72 is embedded in a strip-like manner laterally next to the active region of the semiconductor layer sequence 2 in the first material 71. The hatched regions beneath the second material 72 are used merely to more clearly show the position of the second material 72 within the first material 71.

Figure 10G:
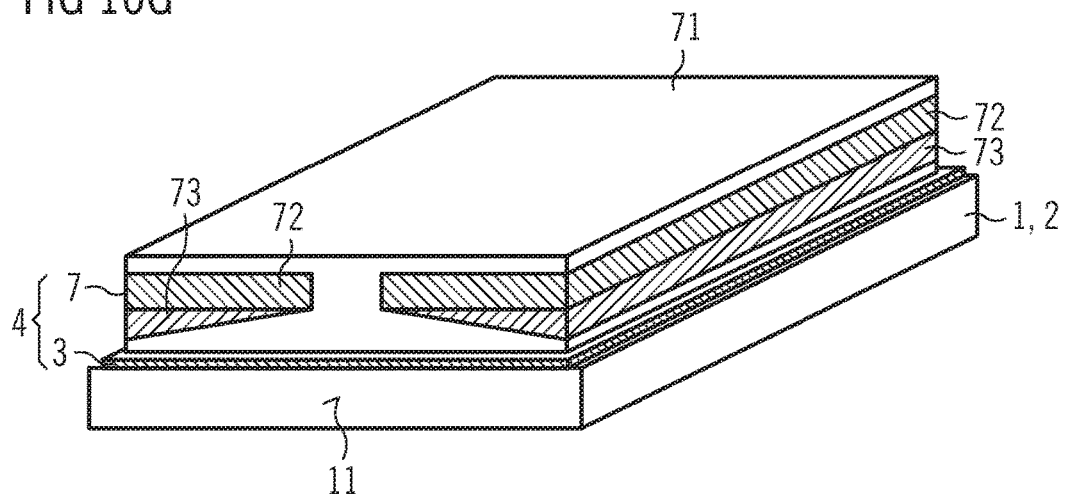

The internal heat sink 7 in accordance with the exemplified embodiment of FIG. 10G has, in addition to the second material 72, a third material 73 which has a different thermal conductivity coefficient compared with the first and second material 71, 72, whereby the heat dissipation and the local thermal resistance of the internal heat sink 7 can be adjusted further.

Figure 10H:
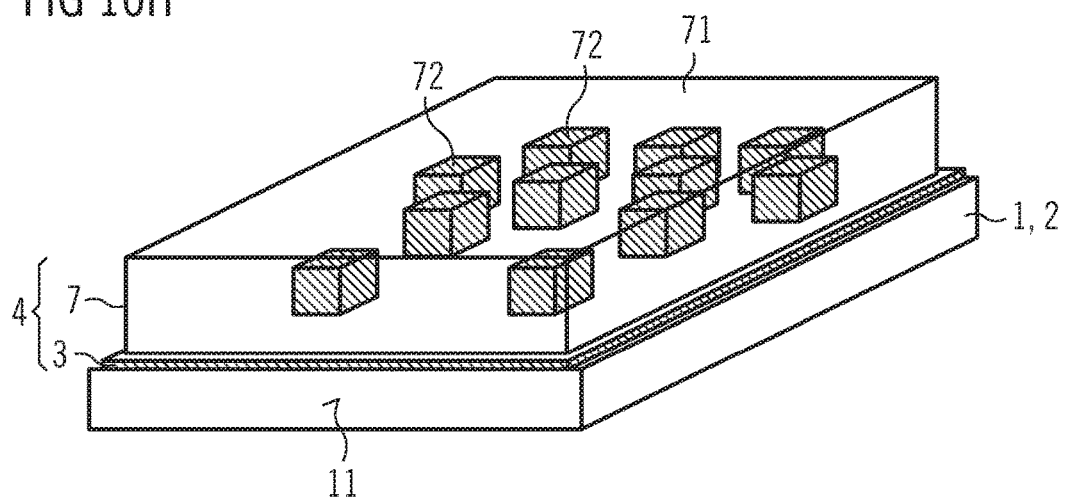

Alternatively or in addition to the illustrated exemplified embodiments in which the second material 72 is arranged continuously in the longitudinal direction, the second material can, as shown in FIG. 10H, also have structuring in points or in regions. For example, the number, size and/or density of the regions having the second material 72 can increase in the first material 71 as the distance to the radiation coupling-out surface 11 increases and/or as the lateral distance to the active region increases.

Figure 11:
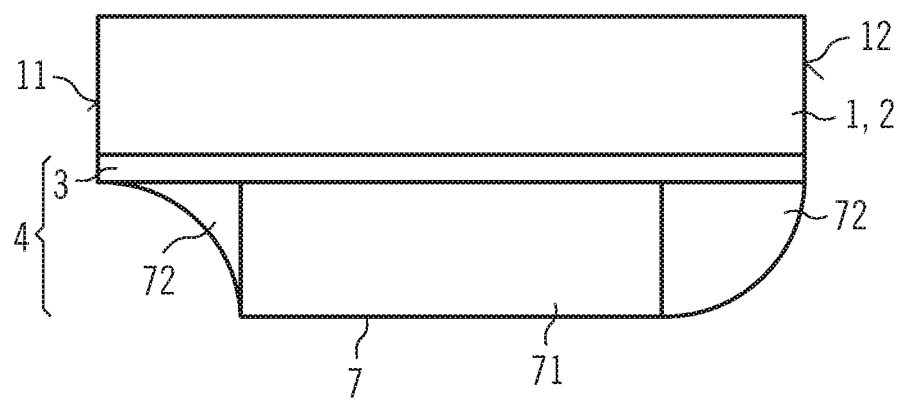

FIG. 11 illustrates a further exemplified embodiment of a semiconductor laser diode having an internal heat sink 7 formed as a structured heat-dissipating layer 4, which heat sink comprises a structured first material 71 which is at a distance to the radiation coupling-out surface 11 and to the rear surface 12, so that the semiconductor layer sequence 2 and the metallization layer 3 form a protrusion over the first material 71. The protrusion can be produced, for example, by lithographic structuring in an order of magnitude of, e.g., a few micrometers and can obviate the need to adjust the semiconductor laser diode precisely to the edge of an external heat sink or an external carrier, which is required in the prior art to ensure sufficient cooling of the radiation coupling-out surface and high reliability associated therewith. Since it is also typically required in the prior art to arrange an internal heat sink spaced apart from the radiation coupling-out surface in order to be able to break the bevel forming the radiation coupling-out surface with a high degree of quality, the cooling at the radiation coupling-out surface is hereby impaired in the prior art.

In order to improve the thermal bonding of the radiation coupling-out surface 11 and the rear surface 12, in the exemplified embodiment shown in this case, a channel having an effectively heat-conducting second material 72 is formed in each of these regions so that a self adjusted thermal bonding of the radiation coupling-out surface 11 and the rear surface 12 can be produced. Such channels can be effected, for example, by applying a deposition having the second material 72 adjoining the first material 71, wherein the second material 72 comprises or is a material which melts at a low temperature and having good thermal conductivity, e.g., a metal such as indium or tin. Such a deposition is preferably applied, e.g., by breaking, prior to producing the radiation coupling-out surface 11 on the relevant regions of a wafer composite consisting of a plurality of semiconductor laser diodes which are still connected, and is melted, only after separating the semiconductor laser diodes, by heating to above the melting point of the second material 72 to the extent that an automatically adjusting channel is formed. The channel can be formed to be concave or convex depending upon the material, provided amount, dimensions and process parameters.

The features, described and illustrated in the exemplified embodiments, relating to the structured current-supplying layer, the metallization layer and the internal heat sink can also be combined together in accordance with further exemplified embodiments which are not explicitly shown in order to combine the respective effects and advantages.

The invention is not limited to the exemplified embodiments by the description using same. Rather, the invention includes any new feature and any combination of features what includes in particular any combination of features in the claims, even if this feature or this combination itself is not explicitly stated in the claims or in the exemplified embodiments.

The invention claimed is:
1. A semiconductor laser diode comprising:
a semiconductor layer sequence having semiconductor layers applied vertically one above the other including an active layer which comprises an active region having a width of greater than or equal to 30 μm, the active layer configured to emit laser radiation during operation via a radiation coupling-out surface, wherein the radiation coupling-out surface is formed by a lateral surface of the semiconductor layer sequence and forms, with an opposite rear surface, a resonator having lateral gain-guiding in a longitudinal direction, and wherein the semiconductor layer sequence is configured to be heated in a thermal region of influence by reason of the operation;
a metallization layer in direct contact with at least a sub-region of a top side of the semiconductor layer sequence, wherein the top side comprises a semiconductor cover layer, and wherein the metallization layer has a cumulative width and a ratio of the cumulative width to a width of the thermal region of influence varies in dependence upon a distance to the radiation coupling-out surface;
a structured heat-dissipating layer on the top side of the semiconductor layer sequence, wherein the structured heat-dissipating layer comprises at least the metallization layer, wherein the structured heat-dissipating layer allows heat dissipation from the active region which varies in a longitudinal and/or a lateral direction; and an internal heat sink in direct contact with the metallization layer, wherein the structured heat-dissipating layer comprises the internal heat sink, wherein the internal heat sink has a structuring at least in the lateral and/or the longitudinal direction, wherein structuring of the internal heat sink comprises materials having different thermal conductivities such that the internal heat sink has a first material which is arranged laterally between regions having a second material, wherein the first material has a higher thermal conductivity than the second material, and wherein the first material has a width that becomes smaller as a longitudinal distance to the radiation coupling-out surface increases.

2. The semiconductor laser diode according to claim 1, wherein the ratio of the cumulative width to the width of the thermal region of influence decreases as the distance to the radiation coupling-out surface increases.

3. The semiconductor laser diode according to claim 1, wherein the cumulative width of the metallization layer decreases as the distance to the radiation coupling-out surface increases.

4. The semiconductor laser diode according to claim 1, wherein the metallization layer is wider close to the radiation coupling-out surface than the thermal region of influence.

5. The semiconductor laser diode according to claim 1, wherein the metallization layer is narrower close to the rear surface than the thermal region of influence.

6. The semiconductor laser diode according to claim 1, wherein the metallization layer has openings, wherein at least one property selected from size, number and density of the openings increase(s) as the distance to the radiation coupling-out surface increases.

7. The semiconductor laser diode according to claim 6, further comprising a material arranged in the openings, the material having a lower thermal conductivity and/or a lower solderability than the metallization layer.

8. The semiconductor laser diode according to claim 2, wherein the metallization layer has an edge in the lateral direction, the edge being structured in an insular manner.

9. The semiconductor laser diode according to claim 1, wherein the semiconductor layer sequence has a semiconductor layer configured to supply current to the active region between the structured heat-dissipating layer and the active region, the semiconductor layer having a width that increases at least in a sub-region as the distance to the radiation coupling-out surface becomes larger.

10. The semiconductor laser diode according to claim 9, wherein the semiconductor layer is the semiconductor cover layer.

11. The semiconductor laser diode according to claim 1, wherein at least one semiconductor layer between the semiconductor cover layer and the active layer has a structured edge in the lateral direction.

12. The semiconductor laser diode according to claim 1, wherein the semiconductor laser diode is configured to be mounted on an external carrier by a solder layer via a solder side.

* * * * *